United States Patent
Boyanov

(10) Patent No.: US 9,960,110 B2
(45) Date of Patent: May 1, 2018

(54) SELF-ENCLOSED ASYMMETRIC INTERCONNECT STRUCTURES

(75) Inventor: Boyan Boyanov, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 13/976,456

(22) PCT Filed: Dec. 30, 2011

(86) PCT No.: PCT/US2011/068159
§ 371 (c)(1),
(2), (4) Date: Oct. 2, 2013

(87) PCT Pub. No.: WO2013/101204
PCT Pub. Date: Jul. 4, 2013

(65) Prior Publication Data
US 2014/0117558 A1 May 1, 2014

(51) Int. Cl.
*H01L 23/528* (2006.01)
*H01L 21/768* (2006.01)
(Continued)

(52) U.S. Cl.
CPC .......... *H01L 23/522* (2013.01); *H01L 21/768* (2013.01); *H01L 21/76804* (2013.01);
(Continued)

(58) Field of Classification Search
CPC .......... H01L 23/5226; H01L 21/76804; H01L 21/76829; H01L 21/76834; H01L 21/7685; H01L 21/76865; H01L 21/76897
(Continued)

(56) References Cited

U.S. PATENT DOCUMENTS 5,214,283 A 5/1993 Le
5,407,860 A 4/1995 Stoltz et al.
(Continued)

FOREIGN PATENT DOCUMENTS

CN 1213851 A 4/1999
EP 0709887 A2 5/1996
(Continued)

OTHER PUBLICATIONS

International Search Report and Written Opinion received for PCT Application No. PCT/US2007/010484, dated Nov. 8, 2007, 10 pages.
(Continued)

*Primary Examiner* — Kevin Parendo
(74) *Attorney, Agent, or Firm* — Finch & Maloney PLLC

(57) ABSTRACT

Techniques are disclosed that enable improved shorting margin between unlanded conductive interconnect features and neighboring conductive features. The techniques provided are particularly useful, for instance, when lithography registration errors cause neighboring conductive features to be physically closer than expected, but can also he used when such proximity is intentional. In some embodiments, the techniques can be implemented using a layer of electromigration management material (EMM) and one or more insulator layers, wherein the various layers are provisioned to enable a differential etch rate. In particular, the overall etch rate of materials above the target landing pad is faster than the overall etch rate of materials above the off-target landing pad, which results in a self-enclosed conductive interconnect feature having an asymmetric taper or profile. The differential etch rate may result, for example, from configuration of the EMM layer, or from accompanying insulator layers having different etch rates.

25 Claims, 14 Drawing Sheets

(51) Int. Cl.
  *H01L 23/522* (2006.01)
  *H01L 23/532* (2006.01)
  *H01L 21/311* (2006.01)
  *H01L 21/3213* (2006.01)

(52) U.S. Cl.
  CPC .. *H01L 21/76829* (2013.01); *H01L 21/76834* (2013.01); *H01L 21/76849* (2013.01); *H01L 21/76883* (2013.01); *H01L 23/5226* (2013.01); *H01L 23/53295* (2013.01); *H01L 21/76897* (2013.01); *H01L 2924/0002* (2013.01)

(58) Field of Classification Search
  USPC .................................. 438/640, 643; 257/774
  See application file for complete search history.

(56) References Cited

U.S. PATENT DOCUMENTS

| | | |
|---|---|---|
| 5,656,543 A | 8/1997 | Chung |
| 5,702,981 A | 12/1997 | Maniar et al. |
| 5,759,913 A | 6/1998 | Fulford et al. |
| 5,876,798 A | 3/1999 | Vassiliev |
| 5,880,018 A | 3/1999 | Boeck et al. |
| 5,982,035 A | 11/1999 | Tran et al. |
| 6,035,530 A | 3/2000 | Hong |
| 6,064,118 A | 5/2000 | Sasaki |
| 6,110,819 A | 8/2000 | Colgan et al. |
| 6,150,723 A | 11/2000 | Harper et al. |
| 6,191,027 B1 | 2/2001 | Omura |
| 6,207,556 B1 | 3/2001 | Hsu |
| 6,226,171 B1 * | 5/2001 | Beilin et al. ............... 361/306.3 |
| 6,252,290 B1 | 6/2001 | Quek et al. |
| 6,255,224 B1 | 7/2001 | Kim |
| 6,265,321 B1 | 7/2001 | Chooi et al. |
| 6,300,236 B1 | 10/2001 | Harper et al. |
| 6,300,683 B1 * | 10/2001 | Nagasaka ......... H01L 21/76804 257/303 |
| 6,303,404 B1 | 10/2001 | Moon et al. |
| 6,303,464 B1 | 10/2001 | Gaw et al. |
| 6,309,970 B1 | 10/2001 | Ito et al. |
| 6,319,797 B1 * | 11/2001 | Usami ............... H01L 21/02134 257/E21.248 |
| 6,362,073 B2 | 3/2002 | Kim |
| 6,368,939 B1 | 4/2002 | Sasaki |
| 6,423,630 B1 | 7/2002 | Catabay et al. |
| 6,440,839 B1 | 8/2002 | Partovi et al. |
| 6,472,266 B1 | 10/2002 | Yu et al. |
| 6,489,195 B1 | 12/2002 | Hwang et al. |
| 6,495,445 B2 | 12/2002 | Clevenger et al. |
| 6,577,011 B1 | 6/2003 | Buchwalter et al. |
| 6,586,842 B1 * | 7/2003 | You ................... H01L 21/76804 257/758 |
| 6,737,725 B2 | 5/2004 | Grill et al. |
| 6,815,334 B2 * | 11/2004 | Yoon ................ H01L 21/76801 257/E21.576 |
| 6,888,244 B2 | 5/2005 | Engelhardt et al. |
| 6,890,846 B2 | 5/2005 | Noguchi |
| 6,897,508 B2 | 5/2005 | Sneh |
| 6,974,772 B1 | 12/2005 | King et al. |
| 6,995,073 B2 | 2/2006 | Liou |
| 7,030,005 B2 | 4/2006 | Lee |
| 7,030,499 B2 | 4/2006 | Hermes |
| 7,042,095 B2 | 5/2006 | Noguchi et al. |
| 7,144,803 B2 | 12/2006 | Engbrecht et al. |
| 7,312,512 B2 | 12/2007 | Lu et al. |
| 7,358,594 B1 | 4/2008 | Allman et al. |
| 7,392,746 B2 | 7/2008 | Hansen |
| 7,393,776 B2 | 7/2008 | Colburn et al. |
| 7,473,632 B2 | 1/2009 | Ueda |
| 7,579,233 B2 | 8/2009 | Hwang |
| 7,649,239 B2 | 1/2010 | Hussein et al. |
| 7,772,702 B2 | 8/2010 | Bielefeld et al. |
| 7,772,706 B2 | 8/2010 | Balakrishnan et al. |
| 7,923,760 B2 | 4/2011 | Hussein et al. |
| 8,394,701 B2 | 3/2013 | Hussein et al. |
| 8,772,938 B2 | 7/2014 | Boyanov et al. |
| 9,064,872 B2 | 6/2015 | Boyanov et al. |
| 9,455,224 B2 | 9/2016 | Boyanov et al. |
| 9,754,886 B2 | 9/2017 | Boyanov et al. |
| 2001/0016412 A1 | 8/2001 | Lee et al. |
| 2001/0040267 A1 | 11/2001 | Lien et al. |
| 2001/0045658 A1 | 11/2001 | Deboer et al. |
| 2001/0051423 A1 | 12/2001 | Kim et al. |
| 2002/0127844 A1 | 9/2002 | Grill et al. |
| 2002/0140101 A1 | 10/2002 | Yang et al. |
| 2003/0183940 A1 | 10/2003 | Noguchi et al. |
| 2003/0186543 A1 * | 10/2003 | Jiang ................. H01L 21/76831 438/687 |
| 2003/0224591 A1 | 12/2003 | Latchford et al. |
| 2004/0063305 A1 | 4/2004 | Kloster et al. |
| 2004/0084774 A1 | 5/2004 | Li et al. |
| 2004/0121577 A1 | 6/2004 | Yu et al. |
| 2004/0214427 A1 | 10/2004 | Kloster et al. |
| 2004/0266167 A1 | 12/2004 | Dubin et al. |
| 2005/0012219 A1 | 1/2005 | Liou |
| 2005/0062165 A1 | 3/2005 | Saenger et al. |
| 2005/0079700 A1 | 4/2005 | Schindler et al. |
| 2005/0184397 A1 | 8/2005 | Gates et al. |
| 2005/0272256 A1 | 12/2005 | Wang |
| 2005/0285269 A1 | 12/2005 | Cao et al. |
| 2006/0063373 A1 | 3/2006 | Gambino et al. |
| 2006/0081987 A1 * | 4/2006 | Kobayashi ........ H01L 21/76801 257/751 |
| 2006/0170110 A1 | 8/2006 | Akram et al. |
| 2006/0197230 A1 | 9/2006 | Anezaki et al. |
| 2006/0286758 A1 | 12/2006 | Liang et al. |
| 2007/0052101 A1 * | 3/2007 | Usami ............ 257/758 |
| 2007/0178713 A1 * | 8/2007 | Jeng ............. H01L 21/76814 438/787 |
| 2007/0269956 A1 | 11/2007 | Lavoie et al. |
| 2007/0298564 A1 | 12/2007 | Brar et al. |
| 2008/0108219 A1 | 5/2008 | Huebinger et al. |
| 2008/0166870 A1 | 7/2008 | Huang et al. |
| 2009/0121360 A1 * | 5/2009 | Takewaki ............ 257/773 |
| 2010/0081272 A1 * | 4/2010 | Jang ............... H01L 21/76804 438/637 |
| 2010/0197133 A1 * | 8/2010 | Werner ............... H01L 21/0337 438/637 |
| 2010/0314777 A1 * | 12/2010 | Oda ............... H01L 21/76804 257/774 |
| 2011/0092019 A1 * | 4/2011 | Yu ................. H01L 21/76808 438/106 |
| 2011/0220917 A1 * | 9/2011 | Hayashi ............. H01L 21/045 257/77 |
| 2014/0151893 A1 | 6/2014 | Boyanov et al. |
| 2014/0312508 A1 | 10/2014 | Boyanov et al. |
| 2015/0294935 A1 | 10/2015 | Boyanov et al. |
| 2017/0011998 A1 | 1/2017 | Boyanov et al. |

FOREIGN PATENT DOCUMENTS

| | | |
|---|---|---|
| JP | 2002-050686 A | 2/2002 |
| JP | 2002319617 A | 10/2002 |
| KR | 10-1999-0003924 | 1/1999 |
| KR | 10-2001-0003760 A | 1/2001 |
| KR | 10-2003-0002523 A | 1/2003 |
| KR | 10-2003-0049563 A | 6/2003 |
| KR | 10-2002-0021394 | 6/2005 |
| KR | 10-2005-0057784 A | 6/2005 |
| WO | 2007/130368 A2 | 11/2007 |
| WO | 2007/130368 A3 | 12/2007 |
| WO | 2008/036385 A1 | 3/2008 |
| WO | 2009/085506 A1 | 7/2009 |
| WO | 2013/101204 A1 | 7/2013 |

OTHER PUBLICATIONS

International Preliminary Report on Patentability and Written Opinion received for PCT Application No. PCT/US2007/010484, dated Nov. 13, 2008, 8 pages.

(56) References Cited

OTHER PUBLICATIONS

International Search Report and Written Opinion received for PCT Application No. PCT/US2007/020443, dated Jan. 25, 2008, 9 pages.
International Preliminary Report on Patentability and Written Opinion received for PCT Application No. PCT/US2007/020443, dated Apr. 2, 2009, 5 pages.
International Search Report and Written Opinion received for PCT Application No. PCT/US2008/084680, dated Mar. 24, 2009, 14 Pages.
International Preliminary Report on Patentability and Written Opinion received for PCT Application No. PCT/US2008/084680, dated Jul. 8, 2010, 8 Pages.
Noguchi, et al., "Process and Reliability of Air-Gap Cu Interconnect Using 90-nm Node Technology" IEEE Transactions on Electron Devices, vol. 52, Issue No. 3, Mar. 2005, pp. 352-359.
Chan, et al., "Air-Gap Fabrication Using a Sacrificial Polymeric Thin Film Synthesized via Initiated Chemical Vapor Deposition", Journal of the Electrochemical Society, 153(4), Feb. 22, 2006, pp. C223-C228.
International Search Report and Written Opinion received for PCT Application No. PCT/US2011/068159, dated Aug. 9, 2012, 11 pages.
Office Action received for United Kingdom Patent Application No. GB0819769.1, dated Dec. 9, 2010, 3 pages.
Office Action received for German Patent Application No. 112007000966.7, dated May 15, 2013, 2 Pages of Office Action and 2 Pages of English Translation.
Office Action received for German Application No. 112007000966.7, dated Nov. 7, 2012, 7 pages of office Action including 2 pages of English Translation.
Office Action received for German Patent Application No. 112007002215.9-43 dated May 28, 2009, 4 pages of Office Action including 2 pages of English Translation.
Office Action received for German Patent Application No. 112007002215.9-43 dated Oct. 7, 2010, 6 pages of Office Action only.
International Preliminary Report on Patentability and Written Opinion received for PCT Patent Application No. PCT/US2011/068159, dated Jul. 10, 2014, 7 pages.
Notice of Allowance received for Chinese Patent Application No. 200780015999.5, dated Jul. 16, 2010, 2 Pages of Office Action and 2 Pages of Notice of Allowance.
Notice of Allowance received for Chinese Patent Application No. 200780031072.0, dated Jun. 22, 2010, 2 Pages of Office Action and 1 Page of English Translation.
Office Action received for Chinese Patent Application No. 200780031072.0, dated Dec. 11, 2009, 4 pages of Office Action including 1 page of English Translation.
Notice of Allowance received for Taiwan Patent Application No. 96115614, dated Aug. 25, 2011, 2 Pages of Notice of Allowance only.
Office Action for Taiwan Patent Application No. 96115614, dated Dec. 7, 2010, 6 pages of Taiwan Office Action including 1 page of Search Report.
Notice of Allowance received for Taiwan Patent Application No. 96135408, dated Mar. 28, 2013, 2 Pages of Notice of Allowance and 1 Page of English Translation.
Office Action received for Taiwan patent Application No. 96135408, dated May 25, 2011, 7 pages of Taiwan Office Action including 1 page of Search Report.
Office Action received for Taiwan Patent Application No. 96135408, dated Feb. 24, 2012, 5 pages of Taiwan Office Action only.
Office Action received for Taiwan Patent Application No. 97147663, dated Apr. 11, 2012, 6 pages of Office Action including 1 page of Search Report.
U.S. Appl. No. 14/323,246, filed Sep. 3, 2014, 44 pages.
TW Office Action and Search Report dated Nov. 4, 2014, issued by the Intellectual Property Office (the IPO). 27 pages total (11 pages of English translation, 16 pages of original document).
TW Office Action received Apr. 16, 2015 for TW Application No. 101151085, issued by the Intellectual Property Office (IPO) dated Mar. 24, 2015. 21 pages total (9 pages of English translation, 12 pages of the original document).
Korean Office Action for application No. 10-2014-7017469 dated Aug. 4, 2015, issued by the Korean Intellectual Property Office, including English comments from foreign agents, 7 pages.

* cited by examiner

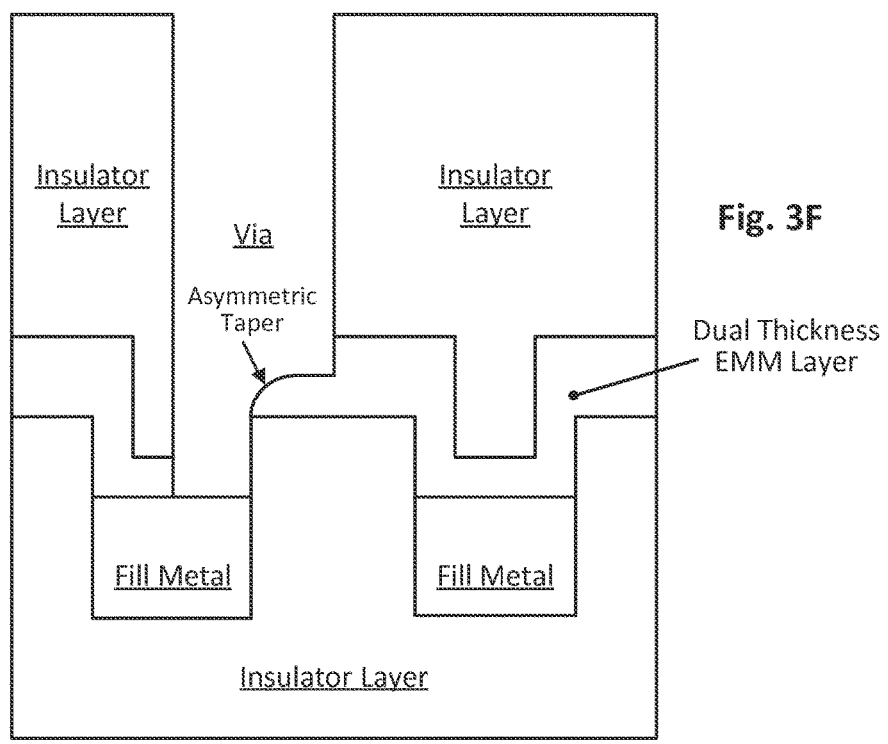
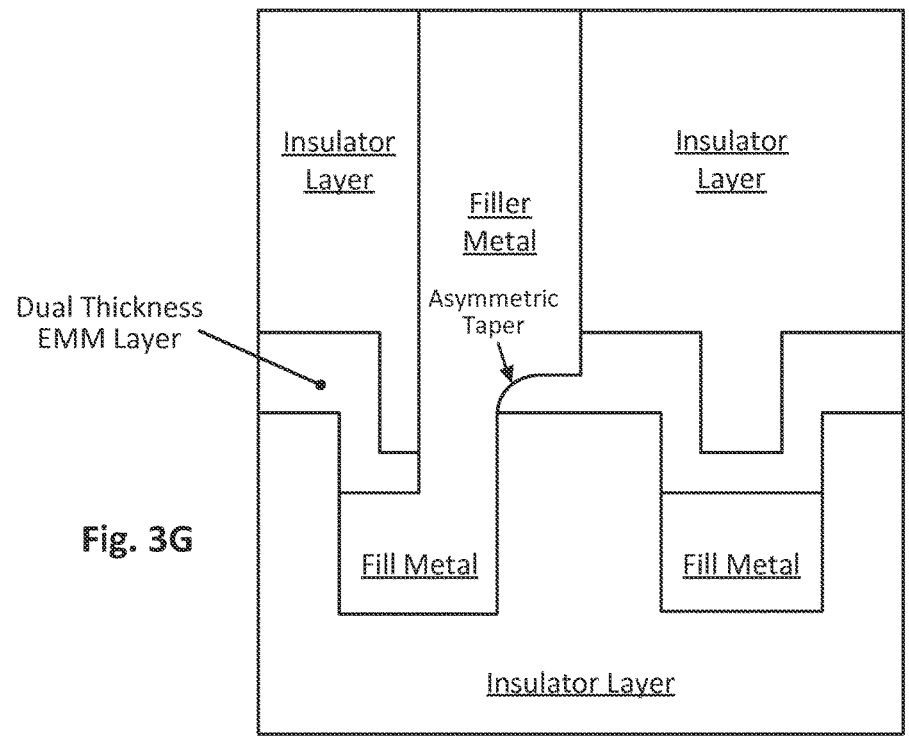

SELF-ENCLOSED ASYMMETRIC INTERCONNECT STRUCTURES

BACKGROUND

In the manufacture of integrated circuits, interconnects are generally formed on a semiconductor substrate using a copper damascene process. Such a process typically begins with a trench and/or via being etched into an insulator layer and then filled with copper metal to form the interconnect. It is often desirable to stack multiple layers to form an integrated circuit, by adding additional layers of insulator and metal-filled features. In such cases, various interconnect features can be used to electrically connect one layer to another, as desired for a given integrated circuit design. However, as device dimensions continue to scale down, the features become narrower and closer together giving rise to a number of non-trivial problems.

BRIEF DESCRIPTION OF THE DRAWINGS

FIGS. 3A-G illustrate cross-section side views of a series of integrated circuit structures showing formation of a self-enclosed interconnect feature in accordance with another embodiment of the present invention.

FIG. 4G' illustrates a cross-section side view of an integrated circuit structure having a self-enclosed interconnect feature in accordance with another embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed that enable improved shorting margin between unlanded conductive interconnect features (e.g., vias) and neighboring conductive features of an integrated circuit. As will be appreciated in light of this disclosure, an unlanded interconnect feature is one where part of the feature is on its target landing pad and part of the feature is not on the target landing pad. The area adjacent to the intended target landing pad is generally referred to herein as the off-target landing pad. The techniques provided are particularly useful, for instance, when lithography registration errors cause neighboring conductive features to be physically closer than expected, but can also be used when such proximity is intentional (such as in integrated circuits where high packing density is desired). In some embodiments, the techniques can be implemented using a layer of electromigration management material (EMM) and one or more insulator layers, wherein the various layers are provisioned to enable a differential etch rate. In particular, the overall etch rate of materials above the target landing pad is faster than the overall etch rate of materials above the off-target landing pad, which results in a self-enclosed conductive interconnect feature having an asymmetric taper or profile. The resulting asymmetric taper effectively increases the shorting margin with respect to that interconnect feature and a conductor neighboring the landing pad of the interconnect feature. The differential nature of the etch rate may result, for example, from the specific configuration of the EMM layer itself, and/or from a combination of insulator layers (or other suitable material layers) having different etch rates.

General Overview

Figure 1:
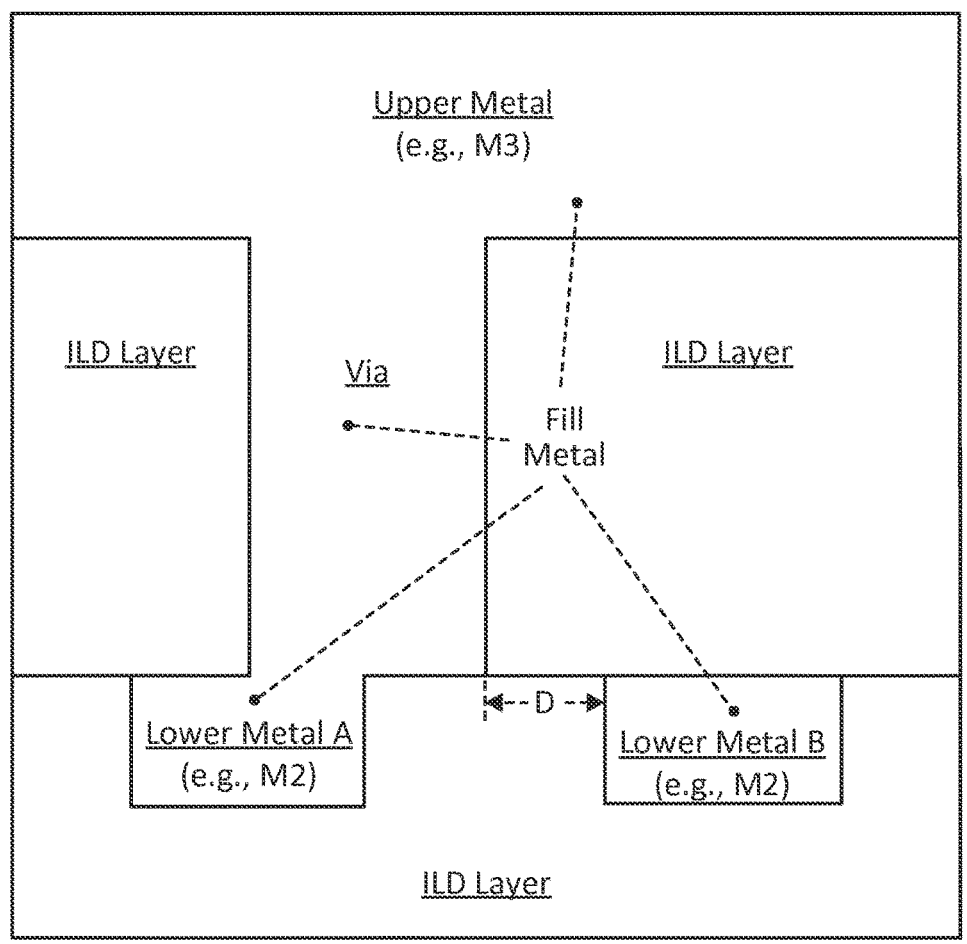
FIG. 1 illustrates an example stacked conductive interconnect feature showing an unlanded via caused by lithography registration error.

As previously explained, it is often desirable to stack multiple layers of an integrated circuit by adding additional layers of insulator and metal-filled features, using standard deposition-lithography techniques. The scaling of such conventional processes to provide smaller feature sizes can be difficult because of, for example, increased significance of lithography registration errors. For instance, FIG. 1 shows an example interconnect structure illustrating the problematic shifting associated with lithography registration errors. As can be seen, the via intended to connect the upper metal (e.g., M3) with the lower metal A (e.g., M2) is misaligned and therefore shifted closer to the neighboring lower metal B, thereby leaving a reduced distance D between the conductive features. This reduced spacing can lead to insufficient shorting margin and decreased time-dependent dielectric breakdown (TDDB), or even a complete short-circuit. Note that even when the via does not completely short to the neighboring conductor, the distance D can be decreased to a point where the thin insulator that separates them is not capable of withstanding the typical fields generated by, for instance, a ~1V power supply. The end result is yield fallout in the case of shorting, or a reliability marginality when the space D is incapable of supporting the operating field. As will be appreciated, while specific example via and metal layers are used here thr illustration purposes, this issue can exist at all lower metal layers (e.g., M1 through M9, etc) and in a more general sense, in any integrated circuit structure having multiple layers of conductive features susceptible to insufficient shorting margin resulting from lithography registration errors or high packing density.

Thus, and in accordance with one embodiment, techniques are provided for forming conductive interconnect features, such as through-vias and damascene features (e.g., trench/via structures) for electrically connecting one layer of an integrated circuit to another layer of that integrated circuit. In some embodiments, the techniques are implemented in an integrated circuit structure that includes a layer of electromigration. management material (EMM) or other suitable intervening layer and one or more insulator layers, wherein the various layers are provisioned to enable a differential etch rate. As will be apparent in light of this disclosure, the differential nature of the etch rate may result from the specific configuration of the EMM layer itself, and/or from a combination of insulator layers having different etch rates. An insulator layer (e.g., continuous or multilayer) is deposited over the EMM layer, and an unlanded via or other conductive interconnect feature can then be patterned and etched into that insulator layer. The etch rate is generally uniform until the EMM (or other suitable intervening layer) is encountered. From that point on, the etch rate of the EMM and/or one or more of the provisioned insulator layers over the off-target landing pad is slower than the etch rate of the EMM and/or insulator material over the target landing pad, resulting in a self-enclosed via (SENT) or other interconnect feature having an asymmetric taper, thereby increasing the shorting margin with respect to its neighboring conductor.

In some such example cases, the EMM layer (or other suitable intervening layer) is uniformly deposited over the underlying fill metal and a bilayer insulator structure having base and cap insulator layers. in this example case, the EMM layer is provided uniformly over both is the target and off-target landing pads, and therefore does not actually contribute to the differential etch rate. Rather, the differential etch rate results from the cap insulator layer having a slower etch rate than the base insulator layer, the cap insulator layer over the target landing pad having been removed during trench formation earlier in the process. Thus, the etch rate is generally uniform until the EMM is encountered. At that point, the overall etch rate of the EMM and cap insulator layer is slower than the overall etch rate of the base insulator layer and EMM layer, resulting in a self-enclosed interconnect feature having an asymmetric taper, thereby increasing the shorting margin with respect to its neighboring conductor. In some specific such cases, for instance, the etch selectivity with respect to the base and cap layers is greater than 5:1, such that the cap insulator material etches more than 5 times slower than the base insulator material for a given base layer etch process. As will be appreciated, however, note that etch selectivity will vary from one embodiment to the next depending on factors such as insulator materials chosen as well as layer thicknesses and etch chemistries and desired shorting margin, and the claimed invention is not intended to be limited to any particular etch rate scheme. Rather, any etch rate scheme that enables an asymmetric taper as described herein can be used (e.g., such as those where the etch selectivity with respect to the base and cap layers is greater than 1:1, or greater than 2:1, etc). As will be further appreciated, the insulator structure may have multiple layers (e.g., trilayer insulator structures having three types of insulator or other intervening material layers each associated with a desired etch rate), and one or more of those layers may impact the differential etch rate. Further note that some embodiments may be implemented without the EMM layer, and just have two or more different material layers (of insulator and/or other suitable material layers) that provide the desired overall differential etch rates to cause the asymmetric taper as described herein.

In other example embodiments, an EMM layer (or other suitable intervening layer) of variable thickness may be deposited over the insulator structure and underlying fill metal, wherein the differential etch rate effectively results from a thinner EMM layer at one or more positions over the underlying fill metal (target landing pad) relative to EMM layer thickness at positions over the insulator structure. In one specific such embodiment, the EMM layer over the insulator material at one or more points is more than twice the thickness of the EMM layer at one or more points over the underlying fill metal. The etch rate is generally uniform until the EMM is encountered, with the variable EMM thickness resulting in a self-enclosed interconnect feature having an asymmetric taper, thereby increasing the shorting margin with respect to its neighboring conductor. In such cases, the insulator structure can have any number of configurations, including those made from a single continuous layer of insulator material, or those made with a bilayer construction having a base layer and a cap layer, or any other desired multilayer construction, so long as the ratio of overall etch rate of materials over the target landing pad to overall etch rate of materials over the off-target landing pad (for a given etch process) is greater than 1 (e,g., >2, or >3, or >5, etc) and the desired asymmetric taper is provided.

In other example cases, a uniform EMM layer (or other suitable intervening layer) is deposited over an insulator structure and patterned during trench formation, prior to deposition of the lower metal layer. The lower metal layer can then be deposited, and a subsequent insulator layer (e.g., continuous or multilayer) can then be deposited over the patterned EMM layer and lower metal layer. An unlanded via or other conductive interconnect feature can then be patterned and etched into the insulator layer. As will be appreciated, the etch rate is generally uniform until the patterned EMM is encountered. However, the EMM (or other suitable intervening layer) etches more slowly than the insulator material or materials, resulting in a self-enclosed interconnect feature having an asymmetric taper, thereby increasing the shorting margin with respect to its neighboring conductor. To generate a self-enclosed interconnect structure in accordance with some such embodiments, the ratio of overall etch rate of materials over the target landing pad to overall etch rate of materials over the off-target landing pad (for a given etch process) is greater than 1.

As will be appreciated, note that an electromigration barrier layer (EMM layer) is not required in all embodiments. For instance, in some example cases, a uniform cap or intervening layer of any desired material (e.g., passivation material such as silicon nitride, diffusion barrier material such as tantalum nitride, insulator material such as silicon dioxide or organosilicate glass, or any other suitable material) is deposited over a base layer (e.g., continuous or multilayer) and patterned during trench formation, prior to deposition of the metal layer. The metal layer can then be deposited into the base layer, and a subsequent base layer (e.g., continuous or multilayer) can then be deposited over the patterned cap/intervening layer and metal. This subsequent base layer may also include a cap/intervening layer, if so desired. In any case, an unlanded via or other conductive interconnect feature can then be patterned and etched into the subsequent base layer. As will be appreciated, the etch rate is generally uniform until the patterned cap/intervening layer is encountered. However, the cap/intervening layer etches more slowly than the base layer, resulting in a self-enclosed interconnect feature having an asymmetric taper, thereby increasing the shorting margin with respect to its neighboring conductor. As will be appreciated in light of this disclosure, to generate a self-enclosed interconnect structure in accordance with some such embodiments, the ratio of overall etch rate of materials over the target landing pad to overall etch rate of materials of the off-target landing pad (for a given etch process) is greater than 1.

Thus, when subsequently provisioning an unlanded interconnect feature in accordance with an embodiment of the present invention, the overall etch rate for materials at one or more points above the target landing pad is faster than the overall etch rate for materials at one or more points above the off-target landing pad, which results in a self-enclosed conductive interconnect feature having an asymmetric taper or profile. Numerous suitable EMM (sometimes referred to herein as electromigration barrier materials), insulator materials (sometimes referred to as dielectrics), metal/alloy materials (sometime referred to as fill metal, nucleation metal or seed metal), and/or any alternative intervening material and, as well as numerous suitable fabrications processes (e.g., wet/dry etching, lithography, chemical vapor deposition, atomic layer deposition, spin-on deposition, or physical vapor deposition, electroplating, electroless deposition), can be used to implement an embodiment of the present invention.

Interconnect Structures With Bilayer Insulator

FIGS. 2A-I illustrate cross-section side views of a series of integrated circuit structures showing formation of a self-enclosed interconnect feature configured in accordance with an embodiment of the present invention.

Figure 2A:
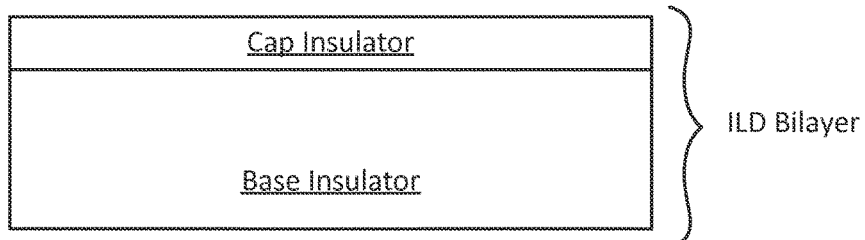
FIGS. 2A-I illustrate cross-section side views of a series of integrated circuit structures showing formation of a self-enclosed interconnect feature in accordance with an embodiment of the present invention.

As can be seen, FIG. 2A illustrates an interlayer dielectric (ILD) layer having a bilayer configuration that includes a base layer and a cap layer. As will be appreciated, the structure may be formed as part of or otherwise on, a substrate and may be configured in a number of ways and using any number of materials, as will be appreciated in light of this disclosure. Each of the base and cap insulator layers can be deposited using conventional processes, such as chemical vapor deposition (CVD), atomic layer deposition (ALD), spin-on deposition (SOD), physical vapor deposition (PVD), or other suitable deposition process, and then be planarized as commonly done (e.g., by way of chemical mechanical planarization, or CMP). The base and cap insulator layer thicknesses can vary greatly, but in some example embodiments are in the range of 50 nm to 5000 nm for the base insulator layer and 2 nm to 200 nm for the cap insulator layer. Either or both of the base and cap insulator layers may comprise multiple sub-layers in some example embodiments (of the same or different materials), or may each be a single layer. In still other embodiments, the base and cap layers are implemented as a gradation of a single layer provided by a single deposition method (e.g., the process conditions in a plasma chamber may be altered to provide a density gradient such that there is no distinct interface). Numerous insulator layer configurations can be used and the claimed invention is not intended to be limited to any particular set of material systems or geometries.

Example insulator materials that can be used include, for instance, nitrides, oxides, oxynitrides, carbides, oxycarbides, polymers, silanes, siloxanes, or other suitable insulator materials. In some embodiments, the base insulator layer is implemented with ultra-low-k insulator materials and the cap insulator layer is implemented with low or high-k dielectric materials. Ultra-low dielectric materials may generally have greater porosity and therefore a faster etch rate relative to denser materials having higher dielectric constants. Example low-k dielectric materials includes silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of ultra-low-k dielectric materials generally include any such low-k materials, but configured with pores or other voids to further reduce density and dielectric constant. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some specific example embodiments, the base insulator material can be, for example, an ultra-low dielectric material such as a porous SiCOH having a dielectric constant k of less than 2.3 and porosity greater than 35 volume %. In such example cases, the cap insulator layer can be, for instance, a relatively denser SiCOH having a dielectric constant k in the range of about 2.8 to 3.0, and a porosity of less than 10 volume % or a plasma-enhanced CND (PECVD) oxide (e.g., silicon dioxide) or nitride (e.g., silicon nitride). In a more general sense, the etch rate of the base insulator layer material is greater than the etch rate of the cap insulator layer material. Continuing with the specific example using porous SiCOH for the base layer and denser SiCOH for the cap layer, an etch process with greater than 2:1 selectivity in the etch of the cap and base layers is achieved. As will be appreciated in light of this disclosure, use of bilayer structure having an ultra-low-k/porous base layer provides a fast etch over the target landing pad, and a relatively higher-k/denser cap layer self-aligns positioning of unlanded via.

Figure 6A:
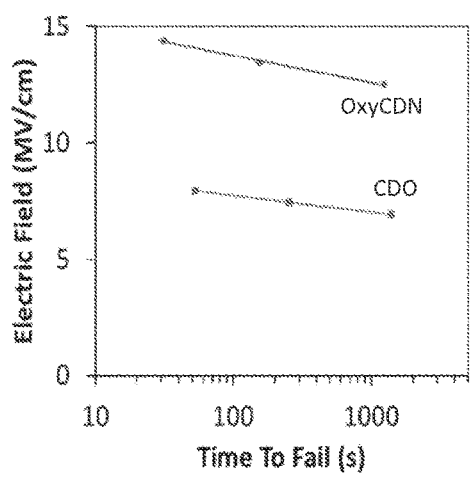
FIGS. 6A-B each illustrates electrical properties of various insulator materials that may be used in accordance with some embodiments of the present invention.
Figure 6B:
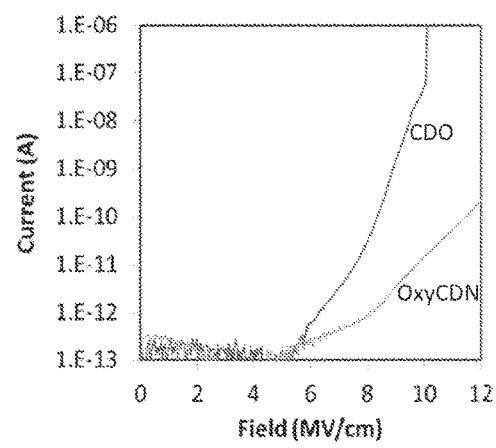

In some further specific example embodiments, the cap layer meets the following criteria: low leakage; extended TDDB stability; good adhesion to the base layer; greater than 5:1 etch selectivity in base layer etch chemistry. As shown in FIG. 6A, carbo-nitride materials exhibit a TDDB that is several orders of magnitude more stable than typical for ultra-low-k dielectrics, In particular, FIG. 6A shows TDDB of a oxy-carbo-nitride material (OxyCDN) compared to a typical CDO material. As shown in FIG. 6B, such carbo-nitride materials also leak significantly less than ultra-low-k dielectrics such as CDO. Moreover, such carbo-nitride materials exhibit a very low etch rate in typical CDO etch chemistry. For instance, selectivity is etch tests show that a full-sized trench (e.g., 50 nm to 100 nm) can be etched in a CDO base layer with very little loss from a 15 nm OxyCDN cap layer, in accordance with an example embodiment.

Figure 2B:
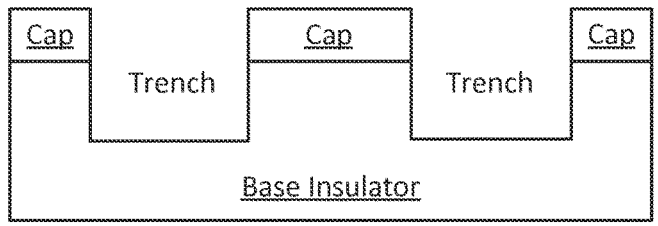
Figure 2C:
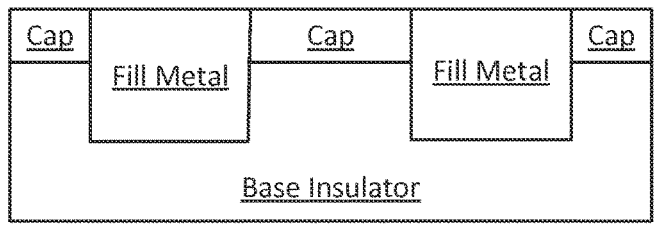

As shown in FIGS. 2B and 2C, conventional processing can be carried out to pattern and etch the trenches (FIG. 2B), and then fill them with metal (FIG. 2C). Although only two trenches are shown, any number of metalized trenches can be provisioned. Any suitable lithography patterning and etch processes can be used to etch the trenches (e.g., wet and/or dry, isotropic and/or anisotropic, etc), and the shape of the trenches will depend on the interconnect feature being formed (e.g, single damascene, dual damascene, etc), as will be appreciated. The metal can be any suitable metal (e.g., copper, nickel, silver, gold, platinum, cobalt, tungsten, or alloys thereof such as copper-cobalt, copper-tin, cobalt phosphorous tungsten, nickel-phosphorous-tungsten, or any other suitable fill metal). Any suitable metal deposition process (e.g., PVD, CVD, ALD, electro or electroless deposition) may be used for depositing the interconnect fill metal into the trenches, depending on factors such as the trench profile and aspect ratio. In some embodiments, the trench may be lined with a barrier layer (to prevent electromigration into the insulator layers) and/or a seed layer (to assist in metalization of the trench), and/or any other desired layers. After metal deposition, the processing may further include, for instance, planarization and cleaning to prepare the structure for subsequent processing.

Figure 2D:
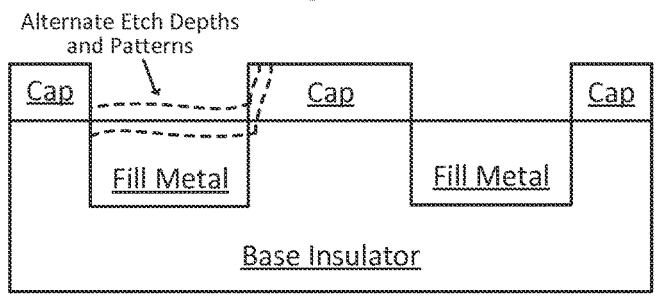
Figure 2E:
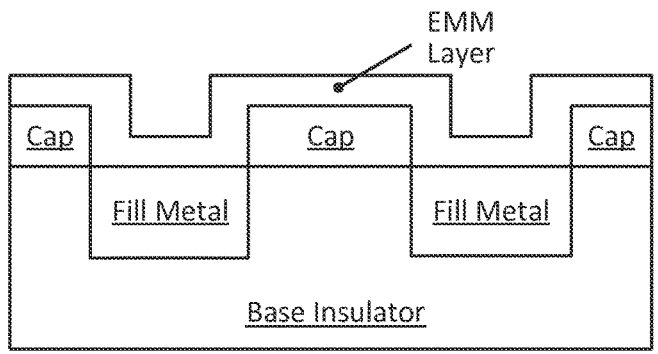

In any case, the metal lines can then be recessed below the surface of the cap layers, as shown in FIG. 2D. This can be achieved, for example, with citric acid/peroxide mixture or any other such chemistry routinely used to etch copper or other typical fill metals (e.g., any acid+peroxide). In some specific embodiments, recessing the metal lines involves wet etching the metal lines uniformly independent of a crystallographic orientation using a chemistry containing an etchant, an oxidizer, an inhibitor, and a solvent. In such cases, adding an inhibitor and a solvent to the etchant provides uniform etching of the fill metal material independent of a crystallographic orientation, by forming, during etching, a passivation layer on the conductive material. The wet etch chemistry containing an etchant, an oxidizer, an inhibitor, and solvent provides control over the depth of the etching of the metal lines, so that only a portion (e.g., 5% to 50%) of the metal line can be recessed. In one specific such embodiment, the chemistry to wet etch the metal lines comprises between about 1% to about 40% by mass of an etchant, between about 1% to about 10% by mass of an oxidizer, and between about 0.1% to about 1% by mass of an inhibitor, and between about 1 to about 60% by mass of an organic solvent. in one embodiment, the chemistry to etch the metal lines can include: an etchant, for example, a glycine, an ethylenediaminetetraacetic acid, an alpha-amino acid, a polycarboxylic acid, or a combination thereof; an oxidizer, for example, a peroxide, an ozone, a permanganate, a chromate, a perborate, a hypohalite, or a combination thereof; an inhibitor, for example, an azole, an amine, an amino acid, a phosphate, a phosphonate, or a combination thereof; and a solvent. The solvent can be, for example, an aqueous system (e.g., water), or an organic solvent (e.g., propylene carbonate, sulfolane, glycol ethers, methylene chloride, and the like). Numerous etch chemistries will be apparent in light of this disclosure. With further reference to FIG. 2D, the depth of the recess in the example embodiment shown is to the top of the base insulator (e.g., about 15 nm to 50 nm), but other embodiments may have a shallower or deeper recess, as indicated by the dashed lines in FIG. 2D showing example alternate etch depths as well as alternate etch patterns. As will be appreciated, while complete metal fill and subsequent recessing are shown in FIGS. 2C and 2D, respectively, other embodiments may include a partial metal fill to the desired level within the trench, thereby eliminating or otherwise reducing the recess etch.

Figure 2F:
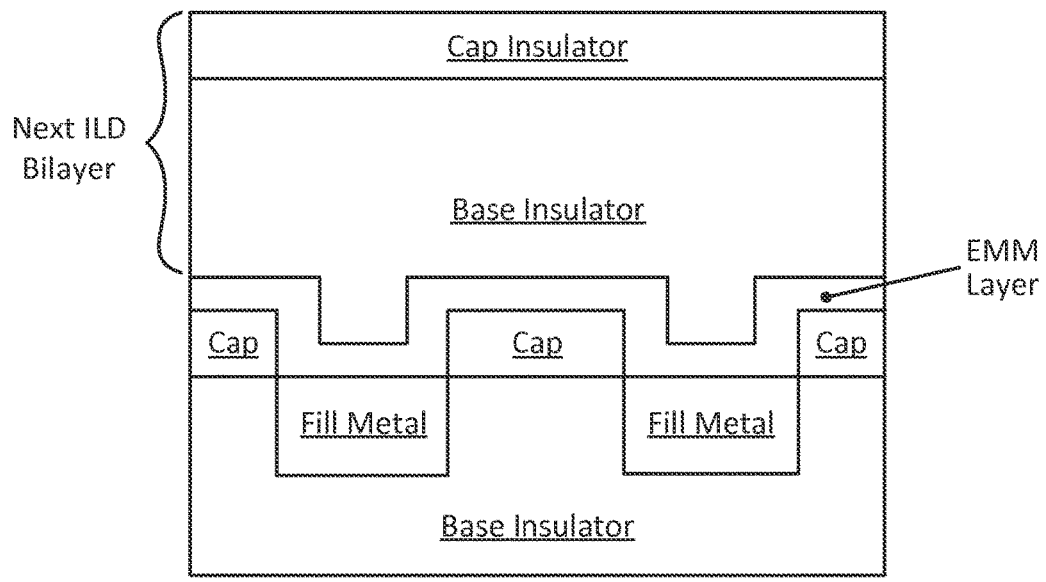

In this example embodiments, a conformal electromigration barrier layer generally referred to herein as an electromigration management (EMM) layer is then deposited on the cap layer and the fill metal. The EMM layer can be deposited using any suitable deposition technique (e.g., ALD, CVD, PVD, etc). In some example embodiments, the EMM layer is implemented with silicon nitride, silicon carbide, silicon carbide oxide, silicon carbide nitride, titanium, tantalum nitride, titanium nitride, tungsten nitride, molybdenum nitride, or other suitable such materials (such as those materials typically used for passivation, etch stops, and electromigration barriers). Note that the etch rate of the EMM can be lower or higher than, or the same as, the etch rates of the bilayer materials, given that the EMM equally effects the overall etch rate over both the target and off-target land pads. In some example cases, the EMM layer has a thickness in the range of, for instance, 2 nm and 200 nm (e.g., 30 nm to 50 nm). As will he appreciated in light of this disclosure, the thickness of the EMM layer can vary greatly, and the claimed invention is not intended to be limited to any particular range of thicknesses. Indeed, some embodiments don't include an EMM layer. The next ILD bilayer included in the stacked integrated circuit structure can then he provided, as shown in FIG. 2F, using processes and base/cap materials as previously described with reference to FIG. 2A.

Figure 2G:
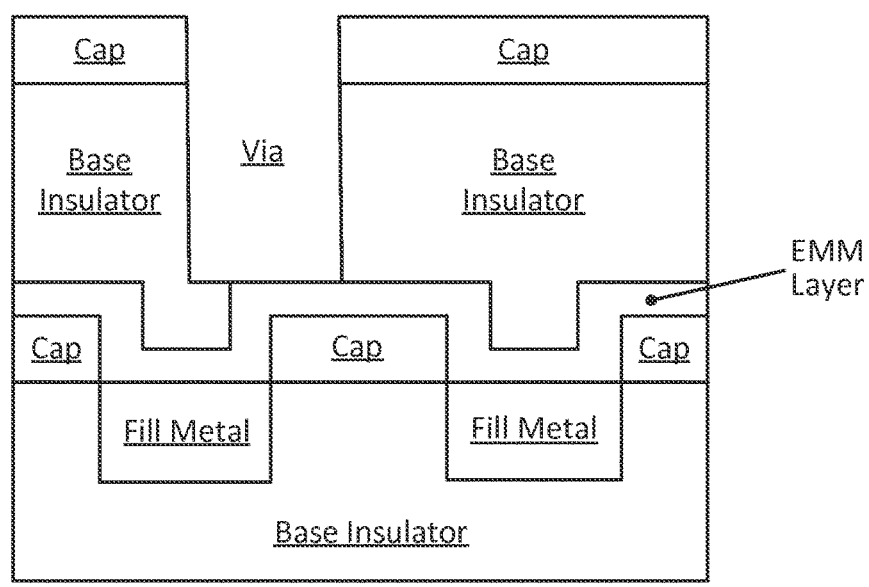

An unlanded via is then patterned and etched, as shown in FIG. 2G. As can be seen, the via is shifted toward the neighboring trench, such that a portion of the via etch is over the target landing pad and a portion of the via etch is over the off-target landing pad. The via can be formed in the bilayer, for example, using standard lithography including via patterning and is subsequent etch processes followed by polishing, cleans, etc, as typically done. The patterning and etch processes can he carried out, for instance, using wet and/or dry etch techniques. The via dimensions can vary, depending on the application. In one example case, the via opening is about 5 nm to 500 nm (e.g., 20 to 45 nm), and has an aspect ratio in the range of about 8:1 to 2:1 (e.g., 4:1). In other embodiments, note that the via may be part of a dual damascene structure that includes the via and an upper wider trench portion, which will he discussed in turn with reference to the example embodiment shown in FIGS. 5A-B. As will be appreciated, the dimensions and aspect ratio of the desired interconnect structure will vary from one embodiment to the next, and the claimed invention is not intended to be limited to any particular range of dimensions or structural configuration (e.g., single or dual damascene, etc).

Figure 2H:
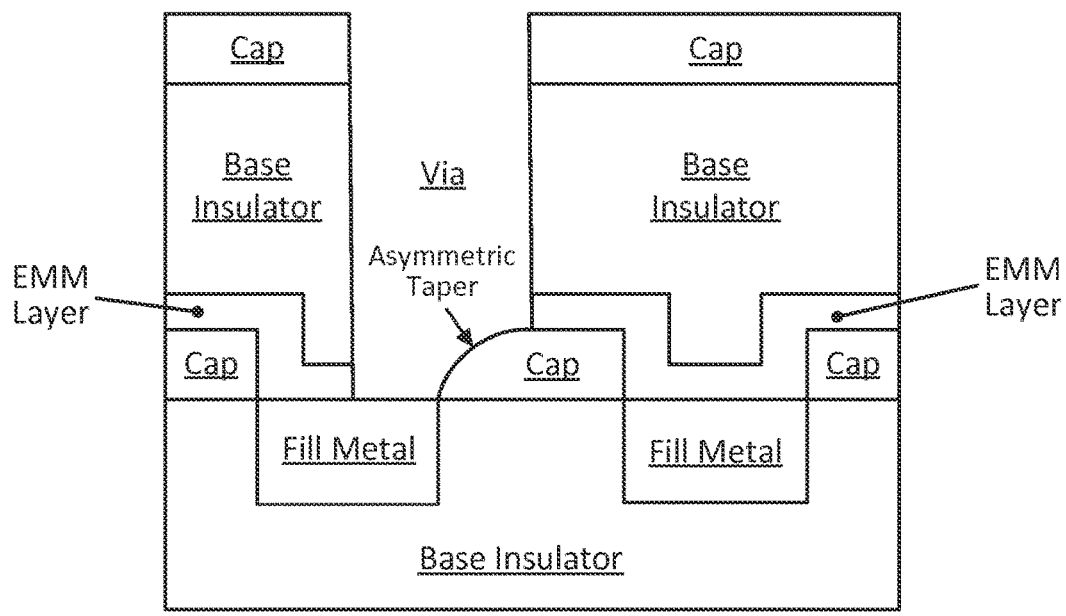

As can be further seen with reference to FIG. 2G, the via etch is uniform as long as the etch surface is above the EMM layer. When the etching of the EMM layer and followed by the underlying ILD cap begins, the differential etch rate relative to the base insulator layer causes the profile of the via to asymmetrically taper as indicated in FIG. 2H, thereby providing an asymmetric taper in the via bottom shape and generally above the off-target landing pad. This is generally because the cap ILD layer has a lower etch rate than the base ILD layer. Said differently, the overall etch rate of materials above the target landing pad is faster than the overall etch rate of materials above the off-target landing pad. In some example cases, the ratio of base layer etch rate to cap layer etch rate for a given etch process is greater than 1, and in still other cases is greater than 5 (although any suitable differential etch rate can be used, such as 1.5:1, 2:1, 3:1, 4:1, etc).

Figure 2I:
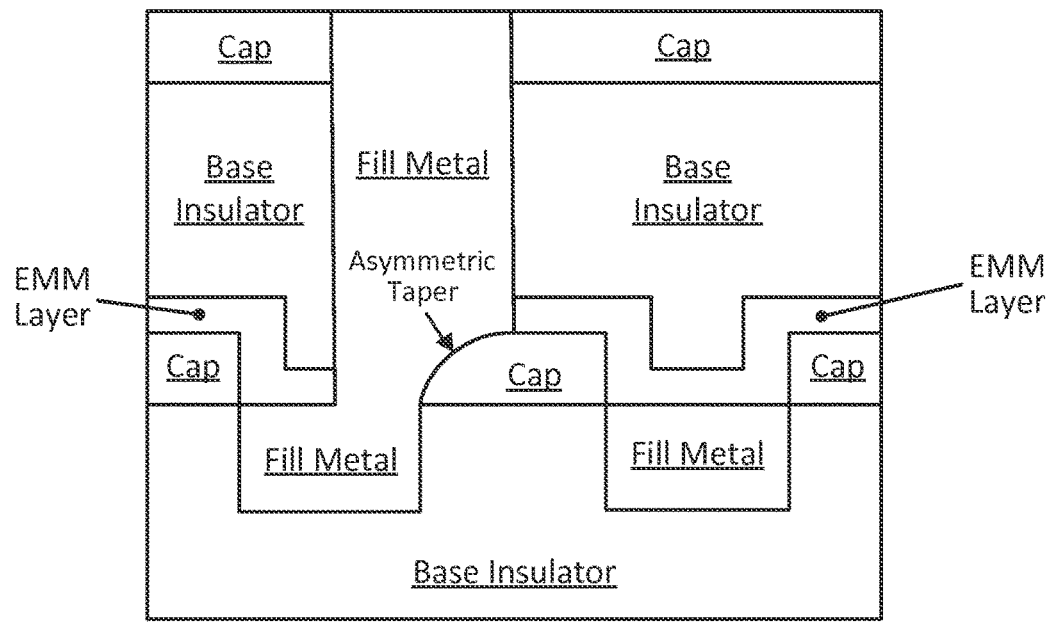
Figure 7A:
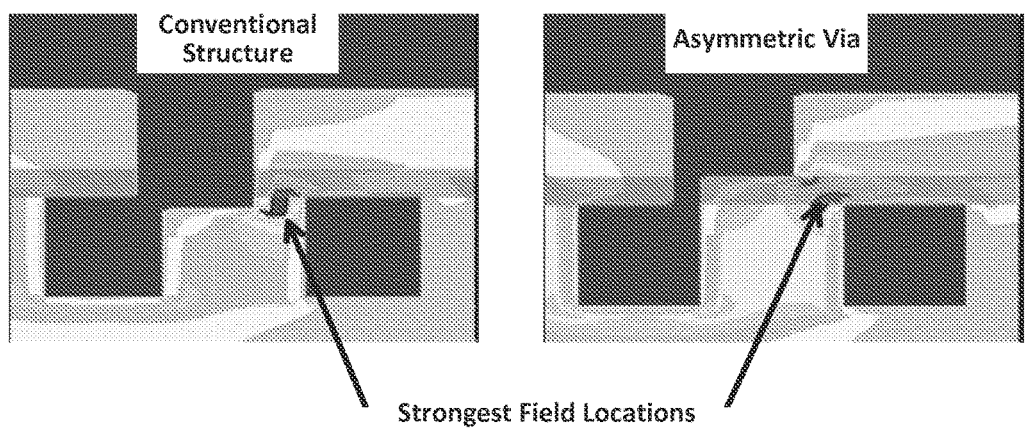
FIG. 7A illustrates a simulation comparing electrical field strengths and locations in a conventional stacked conductive interconnect structure and a stacked conductive interconnect structure configured in accordance with an embodiment of the present invention.
Figure 7B:
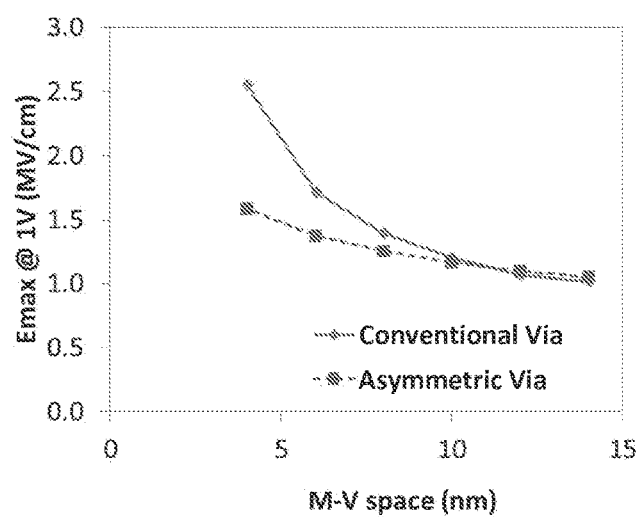
FIG. 7B graphically illustrates a reduction in electrical field strength for stacked conductive interconnect structures configured in accordance with an embodiment of the present invention, relative to conventional stacked conductive interconnect structures.

The via can then be metalized (using materials and processes similar to those discussed with reference to FIG. 2C with respect to filling the lower metal trenches, and may or may not include additional support layer (e.g., diffusion barrier, nucleation layer, adhesion layer, and/or other desired layers). The net result is that the via is self-enclosed and the possibility of shorting to the neighboring fill metal to the right is reduced, as illustrated in FIG. 2I. FIG. 7A illustrates a simulation comparing electrical field strengths and locations in a conventional stacked conductive interconnect structure (such as the one shown in FIG. 1) and a stacked conductive interconnect structure configured in accordance with an embodiment of the present invention (such as the one shown in FIG. 2I). As can be seen, the position of the strongest field shifts from the ILD of the conventional structure (left of FIG. 7A) to the cap layer in the self-enclosed asymmetric via flow (right of FIG. 7A). FIG. 7B graphically illustrates the maximum electrical field strength (Emax) is reduced by 20-30% which translates to a significant increase (e.g., >5× improvement) in time to dielectric breakdown (TDDB).

Numerous variations will be apparent in light of this disclosure. For instance, in some embodiments, the EMM layer can be selectively deposited only over the fill metal areas only. Such selective deposition can be carried out, for instance, after metal deposition and planarization using electroless deposition of an EMM that will only nucleate onto the fill metal. For example, electrolessly deposited cobalt will only nucleate on copper fill metal and not on the ILD material, In a more general sense, the EMM material may be any metal that can be selectively grown on the fill metal so as to effectively provide, a conductive passivation cap over the fill metal. Example conductive EMM materials that can be used include, for instance, nickel, silver, gold, platinum, cobalt, tungsten, or alloys thereof such as copper-cobalt, copper-tin, cobalt phosphorous tungsten, nickel-phosphorous-tungsten, or any other suitable metal or alloy that can be selectively deposited to protect or otherwise cover the fill metal. In such cases have a conductive EMM layer, note that the via etch process need not etch through the EMM layer. Rather, the EMM can effectively be used as an etch stop and the fill metal can then be deposited onto the EMM layer provided over the underlying fill metal, in any such cases, an asymmetric via results from the differential etch rate with respect to the base insulator and cap layer.

Variable Thickness Electromigration Barrier Layer

Figure 3A:
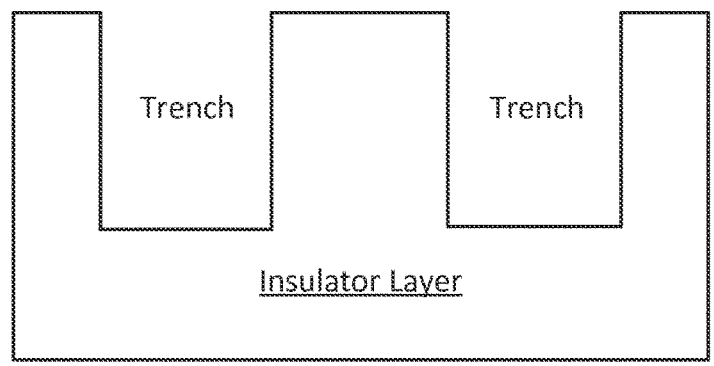
Figure 3B:
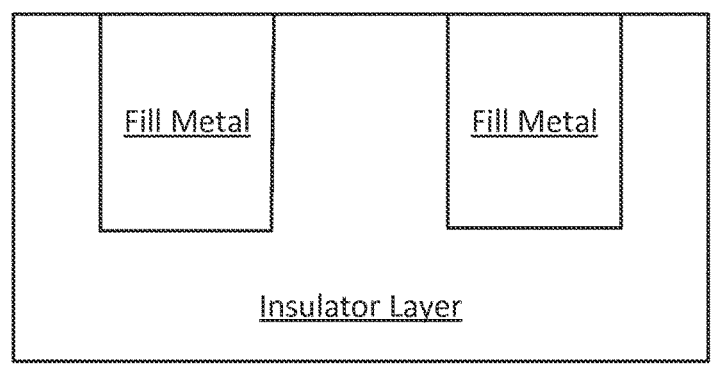
Figure 3C:
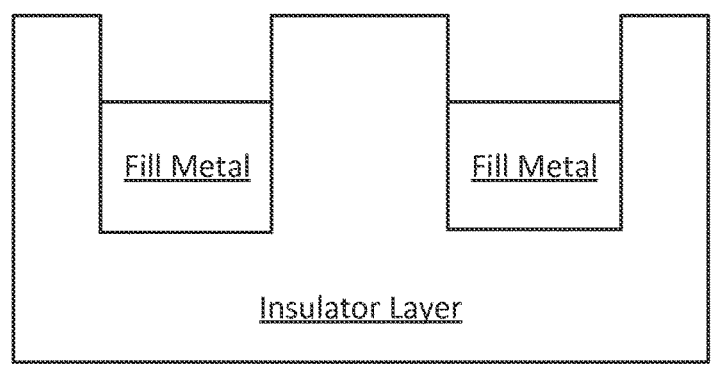
Figure 3D:
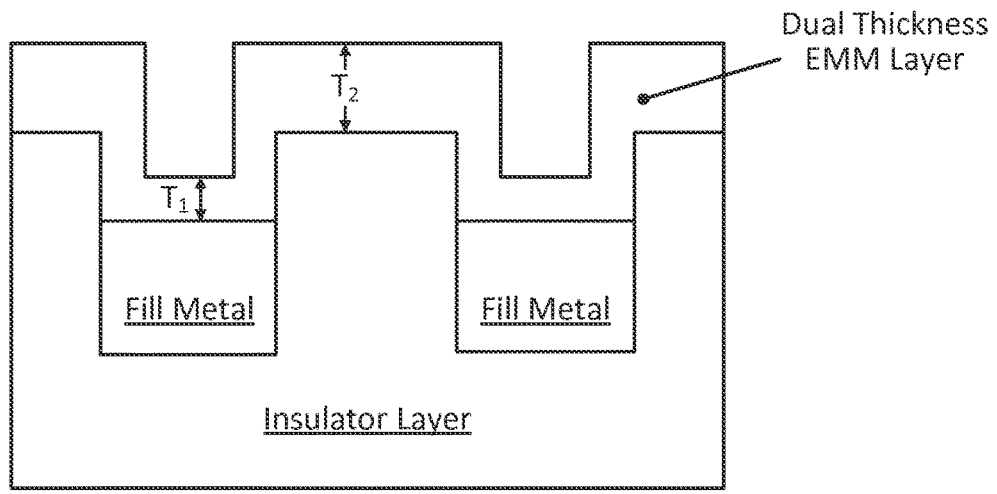

FIGS. 3A-G illustrate cross-section side views of a series of integrated circuit structures showing formation of a self-enclosed interconnect feature configured in accordance with another embodiment of the present invention. In this example embodiment, the insulator layer can be a single or continuous layer of material, rather than a multilayer structure. Just as previously explained, this insulator layer may he formed as part of, or otherwise on, a substrate and may he configured in a number of ways and using any number of material, as will be appreciated in light of this disclosure. Factors such as desired dielectric constant can be used to select the insulator material, which can be, for instance, any of the previously described insulator materials. The insulator can be etched, metalized, and recessed as shown in FIGS. 3A, 3B, and 3C, respectively, and previous relevant discussion with respect to FIGS. 2B, 2C, and 2D is equally applicable here. As shown in FIG. 3D, a variable thickness EMM layer is then provisioned over the insulator and fill metal, wherein the thickness at position $T_2$ of the EMM layer over the insulator material is at least twice as thick as the EMM layer thickness at position $T_1$ over the fill metal. In some cases, $T_2$ thickness is 3× or more greater than $T_1$ thickness. In a more general sense, the thicknesses of the EMM layer can be set depending on the etch rate of the EMM relative to the insulator material. In some example cases, the variable thickness EMM can he provided using, for example, directional deposition where thickness is selectively controlled during the deposition process. In other example cases, the variable thickness EMM layer is provided using a blanket deposition of a uniform thick layer of EMM followed by selective etching (e.g., anisotropic) to thin portions of the that EMM layer where desired. As will be appreciated, the actual layer thickness may vary greatly from one point to the next along the EMM layer, and achieving a perfectly planer EMM layer having only two thicknesses as shown in FIG. 3D is not necessary.

Figure 3E:
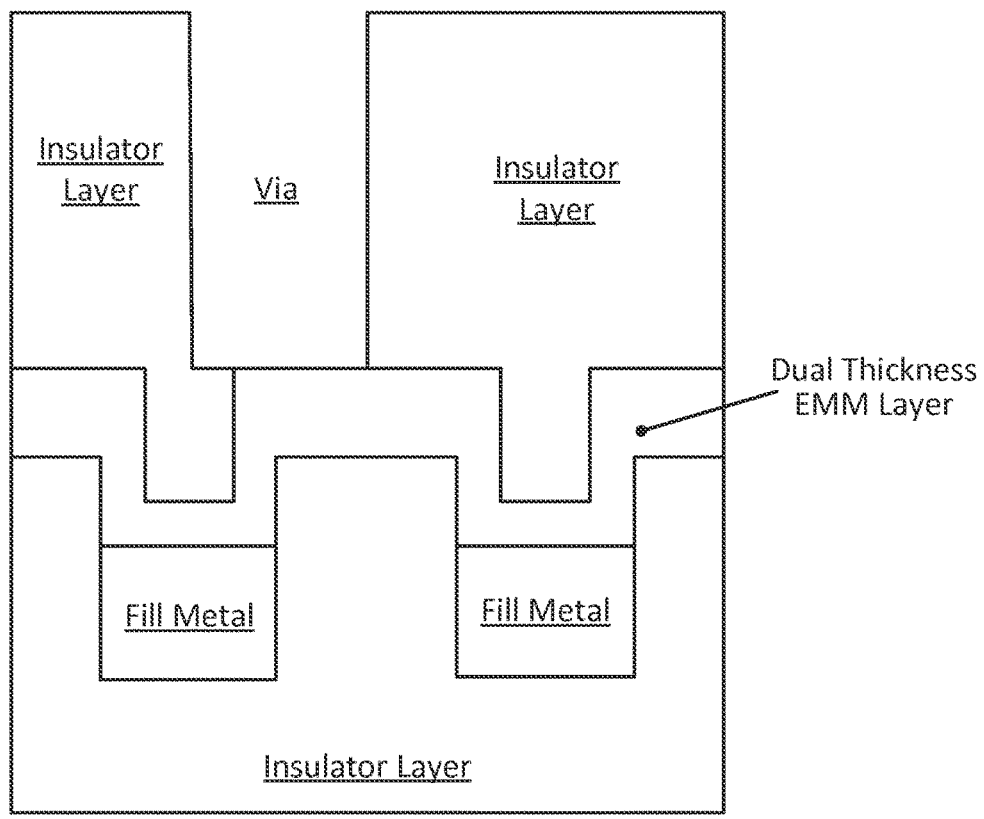

The next insulator layer can then he provided over the EMM layer, and an unlanded via can then be patterned and etched, as shown in FIG. 3E. The previous relevant discussion with respect to providing the next insulator layer and unlanded via is equally applicable here. As can be further seen with reference to FIG. 3E, the via etch is uniform as long as the etch surface is above the EMM layer. When the etching of the relatively thicker part (of the EMM layer begins, the differential etch rate relative to the insulator layer and thin part of the EMM layer causes the profile of the via to asymmetrically taper as indicated in FIG. 3F, thereby providing an asymmetric taper in the via bottom shape and generally above the off-target landing pad. This is generally because the relatively thick part (e.g., $T_2$ and its neighboring positions) of the EMM layer has a lower etch rate than the overall etch rate of the insulator layer and the relatively thin part (e.g., $T_1$ and its neighboring positions) of the EMM layer. Said differently, the overall etch rate of materials above the target landing pad is faster than the overall etch rate of materials above the off-target landing pad. In some example cases, the differential etch rate can be used, such as 1.5:1, 2:1, 3:1, 4:1, etc), and will depend on factors such as the difference between $T_1$ and $T_2$ and the difference in etch rates between the EMM and the insulator material. The unlanded via can then be metalized as shown in FIG. 3G and using techniques and materials as previously discussed, to provide is self-enclosed via having greater shorting margin and reduced electrical field in a fashion similar to that explained with reference to FIG. 2I.

Pre-Etched/Self-Aligned Slow Etch Layer

Figure 4A:
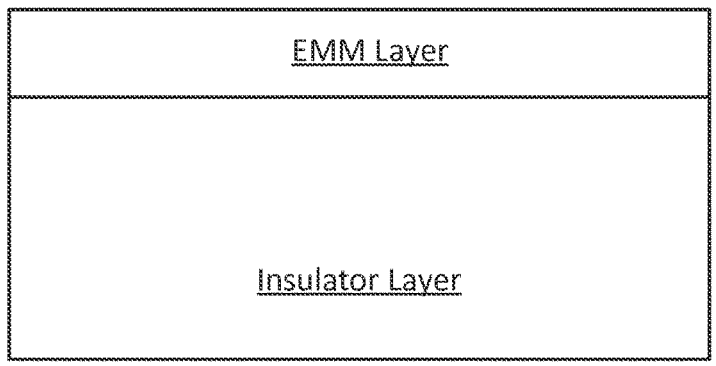
FIGS. 4A-G illustrate cross-section side views of a series of integrated circuit structures showing formation of a self-enclosed interconnect feature in accordance with another embodiment of the present invention.
Figure 4B:
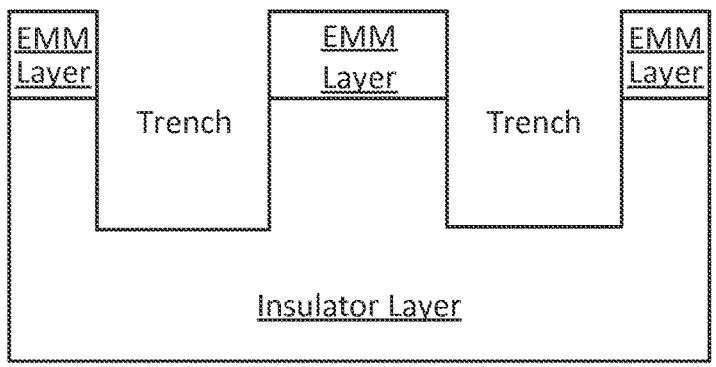
Figure 4C:
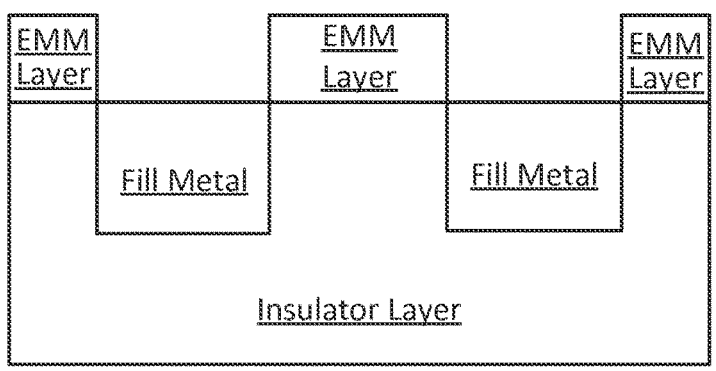

FIGS. 4A-G illustrate cross-section side views of a series of integrated circuit structures showing formation of a self-enclosed interconnect feature configured in accordance with another embodiment of the present invention. In this example embodiment, the insulator layer can also be a single or continuous layer of material, rather than a multilayer structure, and the previous relevant discussion is equally applicable here. However, prior to trench patterning and etching, a conformal and uniform layer of EMM is deposited (e.g., CVD, ALD, PVD, etc), as shown in FIG. 4A. The resulting structure can then be etched, metalized/recessed as shown in FIGS. 4B and 4C, respectively, and previous relevant discussion with respect to FIGS. 2B, 2C, and 2D is equally applicable here. Thus, the electromigration barrier layer is effectively pre-etched from, and self-aligned to, the target landing pads.

Figure 4D:
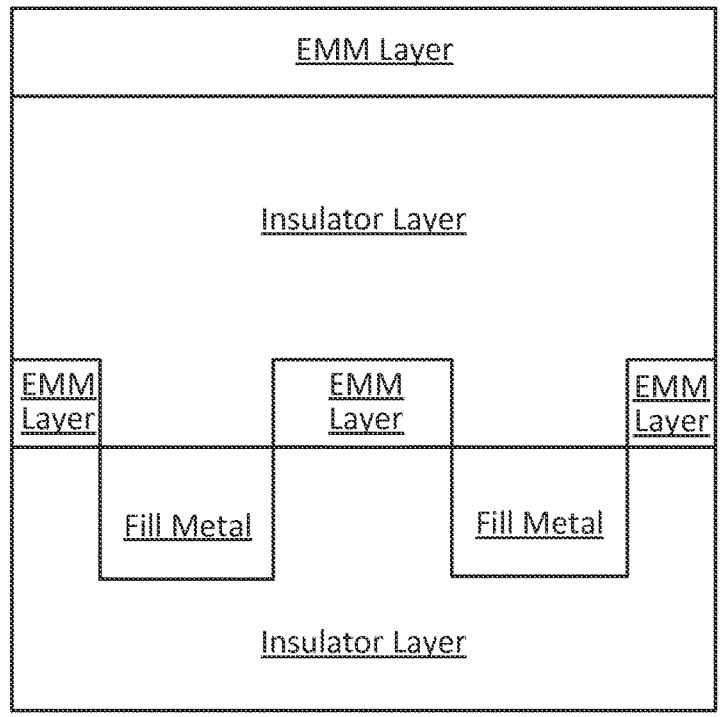
Figure 4E:
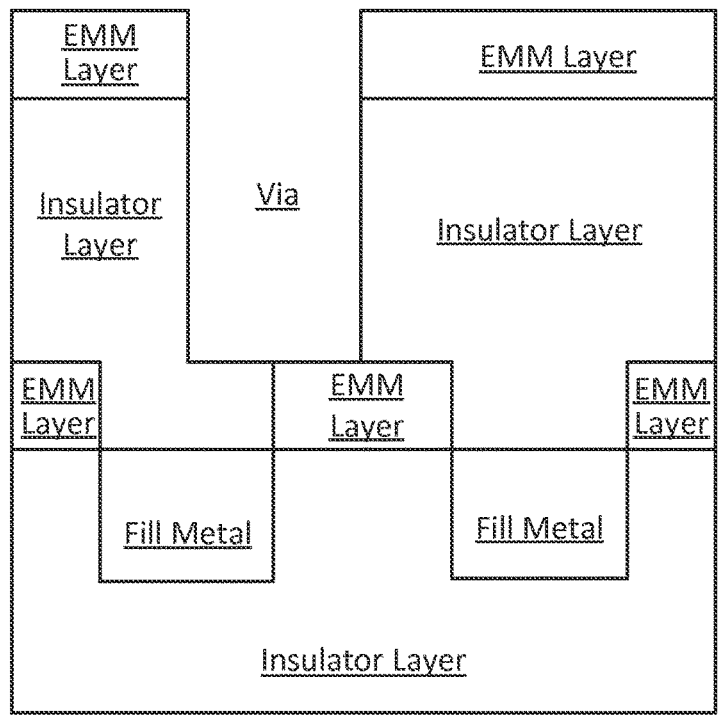
Figure 4F:
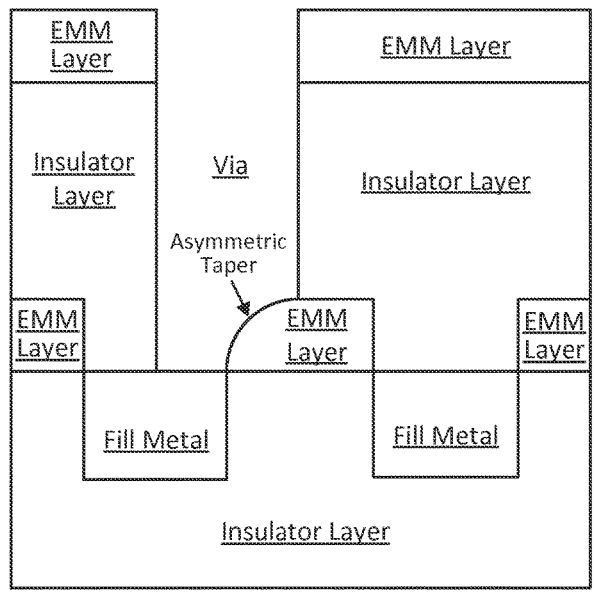

The next insulator and EMM layers can then be provided over the patterned EMM layer and fill metal as shown in FIG. 4D, and an unlanded via can then be patterned and etched, as shown in FIG. 4E. The previous relevant discussion with respect to providing the next insulator and EMM layers and unlanded via is equally applicable here. As can be further seen with reference to FIG. 4E, the via etch is uniform as long as the etch surface is above the EMM layer. When the etching of the EMM layer begins, the differential etch rate relative to the insulator layer causes the profile of the via to asymmetrically taper as indicated in FIG. 4F, thereby providing an asymmetric taper in the via bottom shape and generally above the off-target landing pad. This is generally because the EMM layer has a lower etch rate than the etch rate of the insulator layer. Said differently, the overall etch rate of materials above the target landing pad is faster than the overall etch rate of materials above the off-target landing pad. In some example cases, the differential etch rate can be used, such as 1.5:1, 2:1, 3:1, 4:1, etc), and will depend on the thickness of the EMM layer and the difference in etch rates between the EMM and the insulator material. The unlanded via can then be metalized as shown in FIG. 4G and using any suitable techniques and materials such as those previously discussed, to provide is self-enclosed via having greater shorting margin and reduced electrical field in a fashion similar to that explained with reference to FIG. 2I.

Figure 4G:
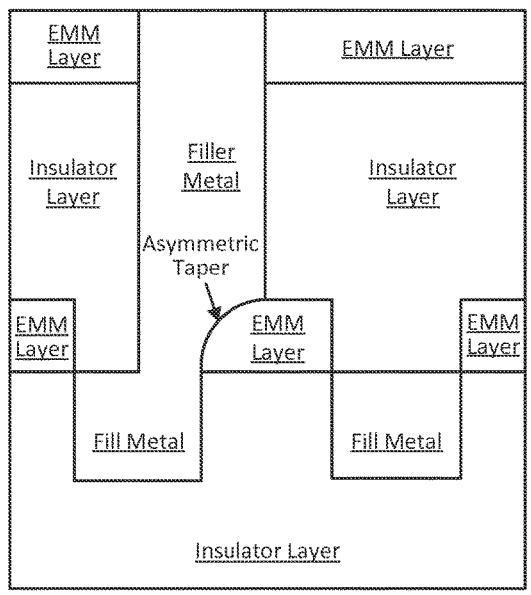
Figure 4G:
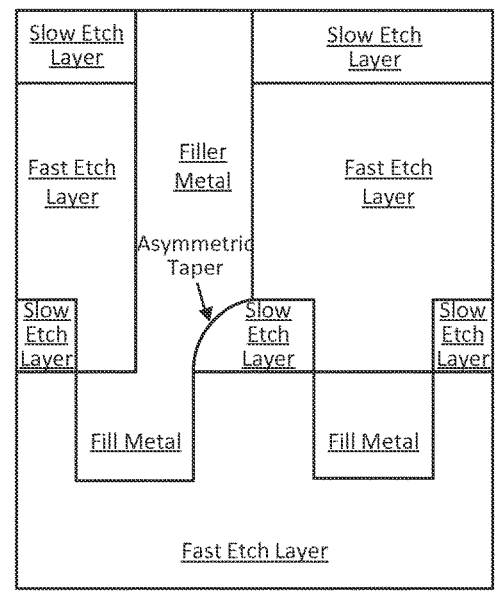

FIG. 4G' illustrates a cross-section side view of an integrated circuit structure having a self-enclosed interconnect feature in accordance with another embodiment of the present invention. As can be seen, this example embodiment is similar to the one shown in FIG. 4G (and the previous relevant discussion equally applies here), except that this embodiment is implemented with fast and slow etch layers. Thus, while the slow etch layer can be an electromigration barrier layer, it need not be. Rather, it can be any suitable material having an etch rate that is slower than the fast etch layer. Likewise, the fast etch layer need not be any particular material; rather, it can be any suitable material having an etch rate that is faster than the slow etch rate layer. In addition to their respective etch rates, the slow and fast etch layer materials can be selected, for instance, based on their desired semiconductor characteristics (e.g., dielectric constant, ability to inhibit diffusion and/or electromigration, etchability with respect to a given etch chemistry or process, etc), cost, accessibility, and/or other such pertinent factors. In any case, the slow etch rate layer is effectively pre-etched from, and self-aligned to, the target landing pads. The next fast etch and slow etch layers can then be provided over the patterned slow etch layer and fill metal as previously discussed with respect to FIG. 4D, and an interconnect feature can then be patterned and etched, such as the unlanded via previously discussed with respect to FIG. 4E. The interconnect feature can then be metalized as previously discussed, to provide is self-enclosed interconnect feature.

Other variations will be apparent in light of this disclosure. For instance, in one such variation, the slow etch layer can be grown with a selective deposition technique after deposition and planarization of the fill metal. in such cases, recessing of the metal could be avoided.

Figure 5A:
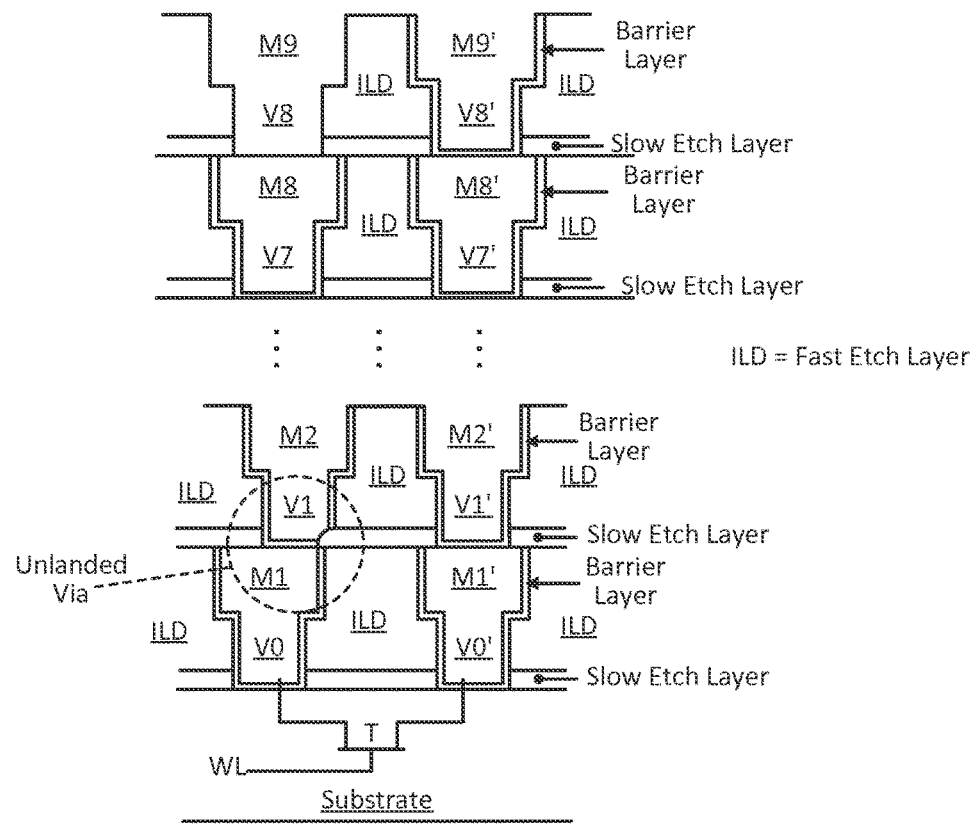
FIG. 5A shows a specific example embodiment where the underlying metal landing pad is a metal line of a lower layer in a dynamic random access memory (DRAM) integrated circuit structure.

FIG. 5A shows a specific example embodiment where the underlying metal landing pad is a metal line of a lower layer in a dynamic random access memory (DRAM) integrated circuit structure, Note, however, any number of other multilayer integrated circuits may have a similar stacked structure, As can be seen, the integrated circuit that includes a plurality of stacked interconnect layers on top of the substrate. in this example case, the substrate is configured with various DRAM cell components integrated therein, such as access transistor T and word line WL. Such DRAM devices typically include a plurality of bit cells, with each cell generally including a storage capacitor communicatively coupled to a bitline by way of an access transistor that is gated by a word line, Other typical DRAM components and features not shown can also be included (e,g., row and column select circuitry, sense circuitry, power select circuitry, etc). Each layer includes various metal lines (M1, M1', M2, M2' . . . M9, and M9') and corresponding vias (V0, V0', V1, V1' . . . V8 and V8') formed within an interlayer dielectric (ILD) material. Note that the layout shown is not intended to implicate any particular feature spacing or density. Rather, this layout is simply an arbitrary example, and any number of layout designs can benefit from an embodiment of the present invention, where conductive interconnect features are formed as described herein, Each layer in this example structure is generally isolated or otherwise demarcated from neighboring layers by a slow etch layer. In contrast, the ILD material provides a fast etch layer, as generally indicated in FIG. 5A. In addition, each metal line and via of this example embodiment is configured with an optional barrier layer (e.g., tantalum or other diffusion barrier). Other embodiments may include fewer or more such layers (e.g., nucleation layers, adhesion layers, etc).

In this particular example case, FIG. 5A shows how via V1 is unlanded and electrically connects metal line M2 to the underlying metal line M1. Note how this unlanded via can be one of many vias, and can also be the only one that is unlanded, or one of many unlanded vias. The off-target landing may be, for instance, due to registration errors, or may be intentional. In any case, and as will be appreciated in light of this disclosure, the fast and slow etch layers effectively cause a differential etch rate that yields an interconnect feature having an asymmetric taper. Thus, for instance, the ratio of fast etch layer etch rate to slow etch layer etch rate for a given etch process is greater than 1, and in still other specific cases is greater than 5 (although any suitable differential etch rate can be used, such as 1.5:1, 2:1, 3:1, 4:1, etc).

Any number of materials can be used to implement the slow and fast etch rate layers, as previously explained, In some specific example embodiments, the fast etch layer material can be, for example, an ultra-low dielectric material such as a porous SiCOH having a dielectric constant k of less than 2.3 and porosity greater than 35 volume %, in such example cases, the slow etch layer material can be, for instance, a relatively denser SiCOH having a dielectric constant k in the range of about 2.8 to 3.0, and a porosity of less than 10 volume % or a plasma-enhanced CVD (PECVD) oxide (e.g., silicon dioxide) or nitride (e.g., silicon nitride).

In an embodiment, a device may include one or more lower levels of metallization that have unlanded vias with asymmetric tapers as described herein, while also having one or more higher levels of metallization where the unlanded vias lack such asymmetric tapers. For example, the lower layers that include M1/V0 and M2/V1 may include asymmetrically tapered unlanded vias as described herein. In that same device, the upper layers that include M8/V7 and M9/V8 may have unlanded vias that do not asymmetrically taper, but instead the unlanded portion of the via may extend down to the metal line below without tapering substantially more or differently than the side of the via that extends down. to the lower metal surface. Such higher metal layers may simply have an interlayer dielectric (ILD) material adjacent the lower line and via, with an etch stop layer above the ILD and another layer of ILD above the etch stop layer. Via holes are created by etching through the upper ILD and etch stop, and unlanded portions of the holes extend farther down into the lower ILD material than if the slow etch/faster etch material scheme and/or recessed metal techniques described herein were used, and do not significantly asymmetrically taper.

Figure 5B:
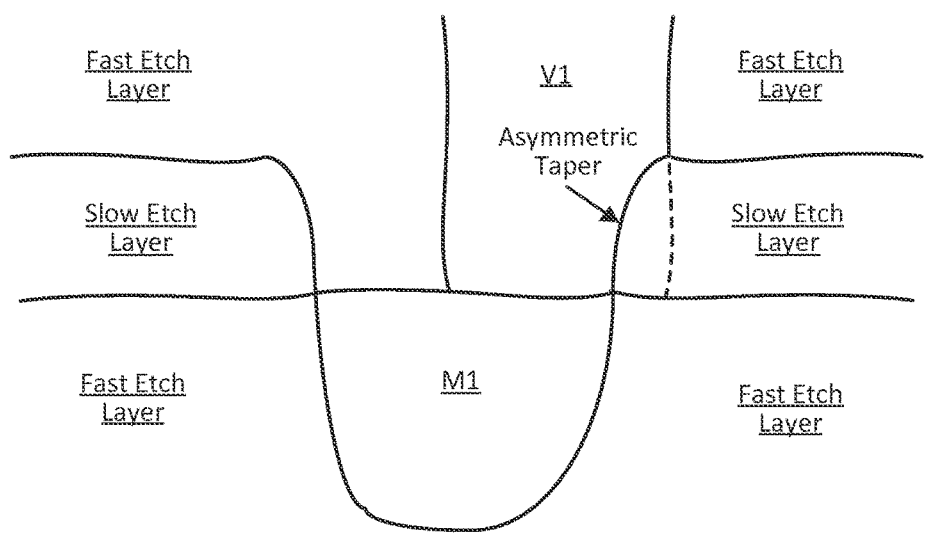
FIGS. 5B and 5C each illustrates an expanded view of the unlanded via shown in FIG. 5A, and configured in accordance with one embodiment of the present invention.

FIG. 5B illustrates an expanded view of the unlanded via shown in FIG. 5A, and configured in accordance with one embodiment of the present invention. As can be seen, FIG. 5B is drawn to reflect real world process limitations, in that the features are not drawn with precise right angles and straight lines. Via V1 shows the asymmetric taper, as well as the normal profile of via V1 (designated with dashed line), if not for the presence of the slow etch layer. In this example case, the asymmetric taper effectively reduces the normal profile of the via V1 by about 25%. The normal profile for the unlanded portion of the via can be readily predicted or otherwise determined by looking at the profile of the landed portion, which has not been interfered with by the slow etch layer. Other embodiments may include a larger profile reduction (e.g., 80% to 95%) or a smaller reduction (5% to 15%). The amount of the reduction will depend on factors such as desired packing density and desired conductivity for the interconnect, This profile reduction can be measured, for instance, at its widest point, which in this example is generally at the interface between metal M1 and the unlanded via V1.

The presence of a profile reduction can be determined, for instance, by taking a cross-section of the via at any point or plane and identifying that the unlanded profile bumps in toward the center axis of the via. The shape of the bump can vary from case to case, but in some cases, looks like a concave depression in the via sidewall that contains slow etch material. Further note that the top of the depression where the taper begins (at the interface that transition from fast to slow etch layers) can be shallower than the bottom of the depression near the on-target landing pad. As shown in this example, the taper effectively plateaus or otherwise self-aligns with the interface between the metal M1 and the fast etch layer. In still other embodiment, note that the top of the depression can have the same depth as the bottom of the depression (almost square or rectangular in nature), Such an asymmetric taper shape may result, for instance, when the ratio of fast etch layer etch rate to slow etch layer etch rate is greater than, for example, 5. Such a differential etch ratio indicates that the edge of the slow edge material will not be substantially diminished or otherwise further rounded during the landing etch process. Numerous shapes and profiles for the asymmetric taper will be apparent in light of this disclosure, and the claimed invention is not intended to be limited to any particular taper type. in various example embodiments, the taper may be angular (e.g., where top of taper is narrower than bottom of taper) or straight (e.g., where top and bottom of taper are about the same), or have any geometric profile, so long as the profile of the unlanded via sidewall is moved toward the center of the via more so than the profile of the landed via sidewall.

In some cases, both sides of the via will naturally taper as a result of the etching process. However, absent the techniques described herein, this taper is substantially symmetrical, with all sides tapering roughly the same amount. Some embodiments of an asymmetrical taper, on the other hand, will taper more adjacent the unlanded portion of the via than adjacent landed portions. In some embodiments the difference between symmetrically tapering and asymmetrically tapering may be described as the symmetrically tapering via having angles of opposing sides at a given distance from the lower metal to which contact is to be made that are within 10% of each other, while an asymmetrically tapering via may have angles of opposing sides at a given distance from the lower metal to which contact is to be made that are greater than about 15% different. Similarly, the concavity described above can be identified in some embodiments by having a landed side of a via with a sidewall that tapers in a substantially continuous manner as it approaches the upper surface of the metal to which it will make contact. The unlanded, asymmetrically tapered, side has a sidewall that substantially follows the taper of the landed side in an upper portion, then has a portion that is significantly more horizontal than the corresponding portion of the other opposing sidewall, then starts to return to an angle more and more similar to the angle of the opposing sidewall as it gets closer to the top of the metal to which it makes contact. Significantly more horizontal may mean an angle difference of ten degrees, twenty degrees, thirty degrees or other angle differences in various embodiments using different materials, etchants, metal recess depths and/or other variations. In an embodiment, a middle third of a via may have sidewalls with an average angle, and as the via approaches the upper surface of the metal to which it makes contact, the landed sidewall of the via that is closer to the middle of the metal continues to have an angle roughly the same as the average angle while the unlanded sidewall of the via that is farther from the middle of the metal has a sidewall angle that gets significantly farther from the average angle. in a few embodiments the "roughly the same" and "significantly farther" angles may be (a) within five degrees and more than seven degrees, (b) within three degrees and more than five degrees, (c) within five degrees and more than ten degrees, respectively. Other examples may be readily seen in other embodiments. These are non-limiting examples and one can readily perceive, in light of this disclosure, when a via is asymmetrical, and particularly perceive when a via has been made asymmetrical by inclusion of a recessed lower metal and/or slower-etching region as described herein.

Figure 5C:
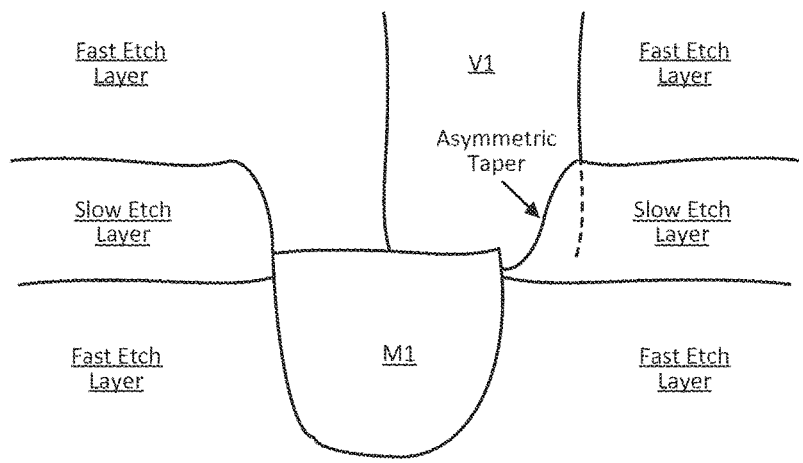

FIG. 5C illustrates an expanded view similar to that shown in 5B, as might be found in one embodiment of the present invention. In the embodiment of FIG. 5C, the M1 material is not recessed to the bottom of the slow etch layer, but instead a portion of M1 remains above the bottom of the slow etch layer. When the via hole is formed, it may be formed using a method such as etching or another suitable method, and to be sure the dielectric material is removed from the surface of M1, it may be slightly overetched so a portion of the slow etch layer adjacent to a side wall of M1 is also removed. The via hole thus extends slightly past the top surface of M1, and in some cases may extend into the fast etch layer, The conductive material formed in the via also extends slightly lower than the upper surface of M1. Despite this fact, the via still has an asymmetric taper on the unlanded side as variously described herein.

EXAMPLE SYSTEM

Figure 8:
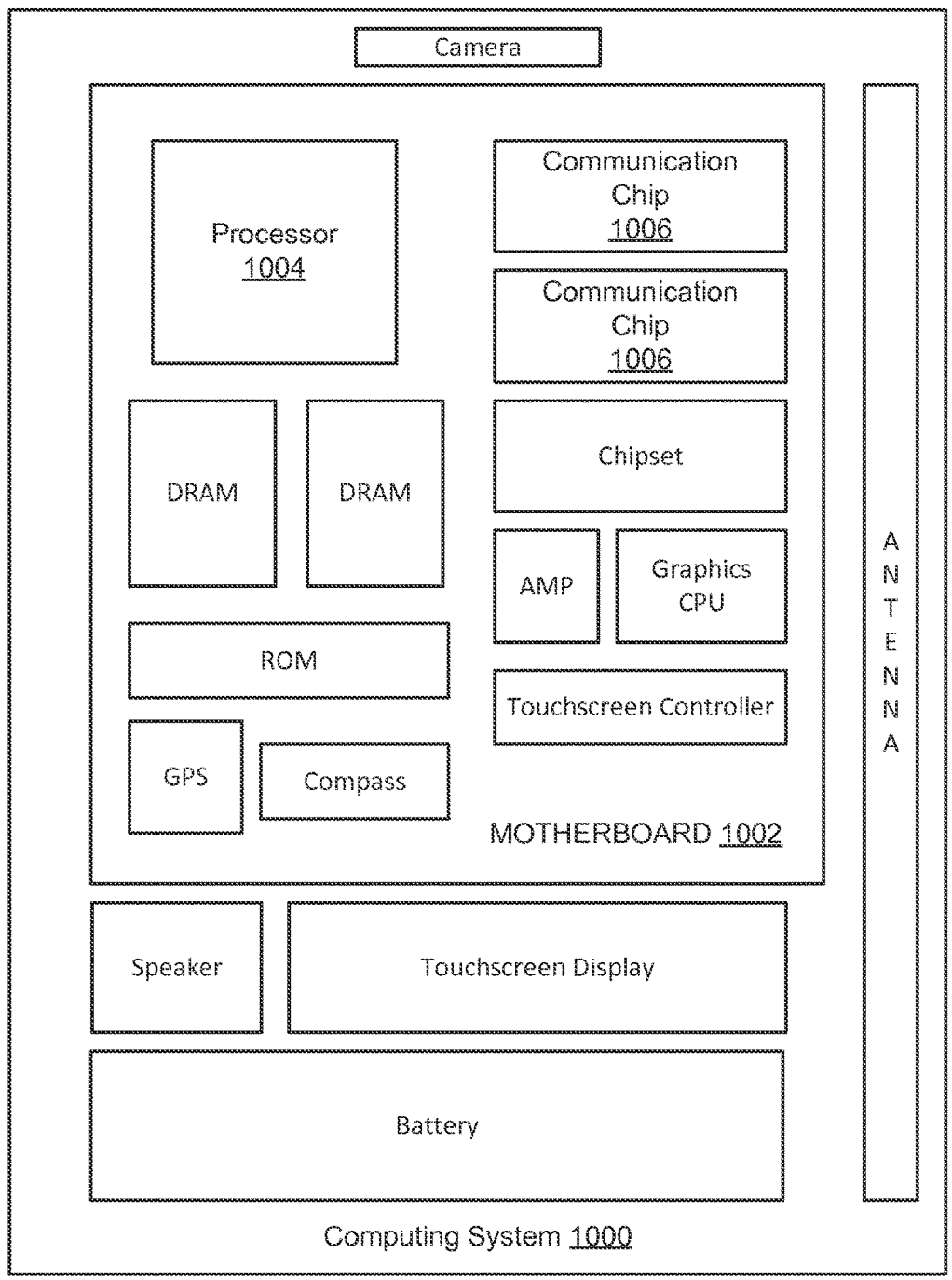
FIG. 8 illustrates an example computing system having one or more devices implemented with conductive structures formed in accordance with an embodiment of the present invention.

FIG. 8 illustrates a computing system 1000 implemented with one or more integrated circuit structures configured and/or otherwise fabricated in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (UPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with one or more self-enclosed conductive interconnect features having an asymmetric profile. These integrated circuit structures can be used, for instance, to implement an on-board processor cache or memory array or other circuit feature that includes interconnects. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE., GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures configured with one or more self-enclosed is conductive interconnect features having an asymmetric profile as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more integrated circuit structures formed as variously described herein (e.g., on-chip processor or memory having an asymmetric interconnect feature). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit features configured with one or more self-enclosed conductive interconnect features having an asymmetric profile as variously described herein.

Numerous embodiments will be apparent, and features described herein can be combined in any number of configurations. One example embodiment of the present invention provides a semiconductor device. The device comprises a first insulator structure having a metal feature therein, and a second insulator structure having a metal feature therein. The device further includes an intervening layer between the first and second insulator structures, wherein the first insulator structure, intervening layer, and second insulator structure are arranged in a stack. The intervening layer can be, for instance, an electromigration barrier layer, a passivation layer, an etch stop layer, or any other desired material layer or multiple such layers or hybrid layer (e.g, etch stop and electromigration barrier layer). The device further includes a conductive interconnect feature connecting the metal feature of the first insulator structure to the metal feature of the second insulator structure, the conductive feature passing through the intervening layer and asymmetrically tapers to land on the metal feature of the first insulator structure. In some cases, the conductive interconnect feature is an unlanded via. In some cases, the asymmetric taper of the conductive interconnect feature increases the distance between the metal feature of the first insulator structure and a neighboring metal feature in the first insulator structure, relative to the distance between those two metal features if no asymmetric taper was present. In some cases, the metal feature of the first insulator structure upon which the conductive interconnect feature lands comprises a target landing pad, and for a given etch process, the overall etch rate of materials above the target landing pad is faster than the overall etch rate of materials above an off-target landing pad below the asymmetric taper. In some cases, each of the first and second insulator structures comprises a multilayer structure of two or more insulator layers, and the asymmetric taper is formed in at least one of the two or more insulator layers. In some specific cases, each of the first and second insulator layers comprises a bilayer structure, each bilayer structure including a base layer and a cap layer. In some such specific cases, the ratio of base layer etch rate to cap layer etch rate for a given etch process is greater than 5. In some cases, the asymmetric taper is at least partially formed in the cap layer of the first insulator layer. in some cases, the base layer comprises an ultra-low dielectric material having a dielectric constant below that of silicon dioxide and the cap layer comprises a dielectric material having higher a density greater than that of the base layer. In some cases, the intervening layer has a variable thickness in that it is thinner at a position over the metal feature of the first insulator structure relative to barrier layer thickness at a position over other portions of the first insulator structure. In one such case, the intervening layer thickness at a position over the metal feature of the first insulator structure is more than two times thinner than intervening layer thickness at a position over the other portions of the first insulator structure. In some cases, for a given etch process, the overall etch rate of insulator material and thinner intervening layer material is faster than the overall etch rate of insulator material and thicker intervening layer material is greater than 1. In one specific such case, the ratio is greater than 5. In some cases, the asymmetric taper is at least partially formed in the intervening layer (e.g., in the thicker part). In some cases, the intervening layer has a uniform thickness and is not on the metal feature of the first insulator structure (because it was etched away when the trench for the metal feature was etched). In some such cases, the metal feature of the first insulator structure upon which the conductive interconnect feature lands comprises a target landing pad, and for a given etch process, the ratio of overall etch rate of materials above the target landing pad to overall etch rate of materials above an off-target landing pad below the asymmetric taper is greater than 5. In some such cases, the asymmetric taper is at least partially formed in the intervening layer. In some such cases, each of the first and second insulator structures is a continuous layer of the same insulator material. Numerous variations will he apparent in light of this disclosure. For example, another embodiment provides an electronic system comprising the device as variously described in this paragraph. The electronic system may be, for example, a computing system (e.g., laptop, desktop, portable communication device, etc).

Another embodiment of the present invention provides a multilayer integrated circuit device. In this example case, the device includes a first insulator structure having one or more metal features therein, and a second insulator structure having one or more metal features therein. The device further includes an electromigration barrier layer between the first and second insulator structures, wherein the first insulator structure, electromigration barrier, and second insulator structure are arranged in a stack. The device further includes a conductive interconnect feature connecting one of the metal features of the first insulator structure to one of the metal features of the second insulator structure, the conductive feature passing through the electromigration barrier layer and asymmetrically tapers to land on the corresponding metal feature of the first insulator structure. The asymmetric taper of the conductive interconnect feature increases the distance between the corresponding metal feature of the first insulator structure and a neighboring metal feature in the first insulator structure, relative to the distance between those two metal features if no asymmetric taper was present. In some cases, each of the first and second insulator structures comprises a multilayer structure of two or more insulator layers, and the asymmetric taper is formed in at least one of the two or more insulator layers. In some cases, the asymmetric taper is at least partially formed in the electromigration barrier layer. In some such cases, each of the first and second insulator structures is a continuous layer of the same insulator material.

Another embodiment of the present invention provides a method for forming a semiconductor device. The method includes providing a first insulator structure having a metal feature therein, and providing a second insulator structure having a metal feature therein. The method further includes providing an electromigration barrier layer between the first and second insulator structures, wherein the first insulator structure, electromigration barrier, and second insulator structure are arranged in a stack. The method further includes providing a conductive interconnect feature connecting the metal feature of the first insulator structure to the metal feature of the second insulator structure, the conductive feature passing through the electromigration barrier layer and asymmetrically tapers to land on the metal feature of the first insulator structure. In some such cases, the conductive interconnect feature is an unlanded via. In some cases, the metal feature of the first insulator structure upon which the conductive interconnect feature lands comprises a target landing pad, and for a given etch process, the overall etch rate of materials above the target landing pad is faster than the overall etch rate of materials above an off-target landing pad below the asymmetric taper.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor device, comprising:
   a first insulator structure having a metal feature therein;
   a second insulator structure having a metal feature therein, wherein the second insulator structure is a single layer having no discernible interface within the single layer;
   an intervening layer distinct from and between the first and second insulator structures, the intervening layer having a relatively lower etch rate for a given etchant than the second insulator structure, the intervening layer including a convex protrusion, wherein the first insulator structure, the intervening layer, and the second insulator structure are arranged in a vertical stack; and
   a conductive interconnect feature connecting the metal feature of the first insulator structure to the metal feature of the second insulator structure, the conductive interconnect feature passing through both the intervening layer and the second insulator structure in at least one horizontal common plane, wherein the conductive interconnect feature includes an asymmetric taper that causes a concave depression on only one side of the conductive interconnect feature, wherein the concave depression tapers towards an opposing side of the conductive interconnect feature to cause the conductive interconnect feature to at least partially land on the metal feature of the first insulator structure, and wherein the concave depression of the conductive interconnect feature is conformal to the convex protrusion of the intervening layer.

2. The device of claim 1 wherein the conductive interconnect feature only partially lands on the metal feature of the first insulator structure and wherein material of the second insulator structure is on a remainder of the metal feature of the first insulator structure.

3. The device of claim 1 wherein the intervening layer:
   is not present over the metal feature of the first insulator structure; or
   has a variable thickness such that the intervening layer is thinner at a position on the metal feature of the first insulator structure relative to the intervening layer at a position on the first insulator structure.

4. The device of claim 1 wherein the intervening layer includes a high-k dielectric material.

5. The device of claim 1 wherein the intervening layer is a single layer of electromigration management material with no discernible interface within that electromigration management material layer.

6. The device of claim 1 wherein no discernible interface exists between the metal feature of the second insulator structure and the conductive interconnect feature.

7. The device of claim 1 wherein the convex protrusion is integral with another portion of the intervening layer that is on the first insulator structure.

8. The device of claim 1 wherein the intervening layer includes one or both of carbon or nitrogen.

9. The device of claim 1 wherein the second insulator structure and the intervening layer include the same material composition but the material of the second insulator structure is relatively more porous than the material of the intervening layer such that the intervening layer has a relatively lower etch rate for a given etchant than the second insulator structure.

10. The device of claim 1 wherein the intervening layer has a variable thickness in that, in sections where the intervening layer is under the second insulator structure, the intervening layer is thinner at a position on the metal feature of the first insulator structure relative to the intervening layer thickness at a position on the first insulator structure.

11. The device of claim 10 wherein the intervening layer thickness at the position on the metal feature of the first insulator structure is more than two times thinner than the intervening layer thickness at the position on the first insulator structure.

12. The device of claim 10 wherein, for the given etchant, the ratio of the etch rate of the second insulator structure material to the etch rate of the intervening layer material is greater than 2.

13. The device of claim 1 wherein, for the given etchant, the ratio of the etch rate of the second insulator structure material to the etch rate of the intervening layer material is greater than 5.

14. The device of claim 1 wherein the opposing side of the conductive interconnect feature is substantially vertical.

15. The device of claim 1 wherein the intervening layer has a uniform thickness in portions not including the convex protrusion, and wherein the intervening layer is not present over the metal feature of the first insulator structure.

16. The device of claim 1 further comprising an electromigration barrier layer between the first insulator structure and the intervening layer.

17. The device of claim 16, wherein the electromigration barrier layer includes different material from the intervening layer.

18. The device of claim 1 wherein the first and second insulator structures include the same insulator material.

19. An electronic system comprising the device of claim 1.

20. A multilayer integrated circuit device, comprising:
a first insulator structure having a metal feature therein;
a second insulator structure having a metal feature therein;
an electromigration barrier layer between the first and second insulator structures, the electromigration barrier layer having a relatively lower etch rate for a given etchant than the second insulator structure, the electromigration barrier layer including a convex protrusion, wherein the first insulator structure, the electromigration barrier layer, and the second insulator structure are arranged in a vertical stack, wherein the electromigration barrier layer is a single layer having no discernible interface within that electromigration barrier layer; and
a conductive interconnect feature connecting the metal feature of the first insulator structure to the metal feature of the second insulator structure, the conductive interconnect feature passing through both the electromigration barrier layer and the second insulator structure in at least one horizontal common plane, wherein the conductive interconnect feature includes an asymmetric taper that causes a concave depression on only one side of the the conductive interconnect feature, wherein the concave depression tapers towards an opposing side of the conductive interconnect feature to cause the conductive interconnect feature to only partially land on the metal feature of the first insulator structure, and wherein the concave depression of the conductive interconnect feature is conformal to the convex protrusion of the electromigration barrier layer.

21. The device of claim 20 wherein the second insulator structure is a single layer having no discernible interface within the single layer.

22. The device of claim 20 wherein the electromigration barrier layer includes one or both of carbon or nitrogen.

23. The device of claim 20 wherein the electromigration barrier layer has a variable thickness such that the electromigration barrier layer is thinner at a position on the metal feature of the first insulator structure relative to the electromigration barrier layer at a position on the first insulator structure.

24. A method for forming a semiconductor device, comprising:
providing a first insulator structure having a metal feature therein;
providing a second insulator structure having a metal feature therein, wherein the second insulator structure is a single layer having no discernible interface within the single layer;
providing an intervening layer that is distinct from and between the first and second insulator structures, the intervening layer having a relatively lower etch rate for a given etchant than the second insulator structure, the intervening layer including a convex protrusion, wherein the first insulator structure, the intervening layer, and the second insulator structure are arranged in a vertical stack; and
providing a conductive interconnect feature connecting the metal feature of the first insulator structure to the metal feature of the second insulator structure, the conductive interconnect feature passing through both the intervening layer and the second insulator structure in at least one horizontal common plane, wherein the conductive interconnect feature includes an asymmetric taper that causes a concave depression on only one side of the conductive interconnect feature, wherein the concave depression tapers towards an opposing side of the conductive interconnect feature to cause the conductive interconnect feature to at least partially land on the metal feature of the first insulator structure, and wherein the concave depression of the conductive interconnect feature is conformal to the convex protrusion of the intervening layer.

25. The method of claim 24 wherein the conductive interconnect feature only partially lands on the metal feature of the first insulator structure.

* * * * *

UNITED STATES PATENT AND TRADEMARK OFFICE
CERTIFICATE OF CORRECTION

Page 1 of 1

PATENT NO. : 9,960,110 B2
APPLICATION NO. : 13/976456
DATED : May 1, 2018
INVENTOR(S) : Boyan Boyanov It is certified that error appears in the above-identified patent and that said Letters Patent is hereby corrected as shown below:

In the Abstract, please replace:
Line 6:
--be physically closer than expected, but can also he used--
To:
--be physically closer than expected, but can also be used--

Signed and Sealed this
Tenth Day of July, 2018

Andrei Iancu
*Director of the United States Patent and Trademark Office*